US006714302B2

(12) United States Patent
Suzuki et al.

(10) Patent No.: US 6,714,302 B2
(45) Date of Patent: *Mar. 30, 2004

(54) ALIGNING METHOD, ALIGNER, AND DEVICE MANUFACTURING METHOD

(75) Inventors: Akiyoshi Suzuki; Minoru Yoshii, both of Tokyo (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/330,157

(22) Filed: Jun. 11, 1999

(65) Prior Publication Data

US 2002/0024671 A1 Feb. 28, 2002

(30) Foreign Application Priority Data

Jun. 30, 1998 (JP) .......................................... 10-184044

(51) Int. Cl.[7] ........................ G03B 27/52; G03B 27/42; G01B 11/00; G01N 21/86
(52) U.S. Cl. .......................... 356/401; 355/55; 355/53; 250/548
(58) Field of Search ................................. 356/399, 400, 356/401.1; 355/53, 55; 250/548

(56) References Cited

U.S. PATENT DOCUMENTS

| 4,708,466 A | * 11/1987 | Isohata et al. ................ 355/53 |
| 4,881,100 A | * 11/1989 | Nakai et al. .................. 355/53 |
| 5,434,026 A | * 7/1995 | Takatsu et al. ............... 430/30 |
| 6,327,022 B1 | 12/2001 | Nishi .......................... 355/53 |

FOREIGN PATENT DOCUMENTS

JP 4-267537 9/1992

* cited by examiner

Primary Examiner—Zandra V. Smith
(74) Attorney, Agent, or Firm—Fitzpatrick, Cella, Harper & Scinto

(57) ABSTRACT

A wafer having a plurality of areas is subjected to multiple exposures or a stitching exposure with a plurality of mask patterns being interchanged. A plurality of wafers are sequentially exposed to the plurality of mask patterns, with one wafer being replaced with a next wafer. When the one wafer is replaced with the next wafer, the next wafer is exposed to the mask pattern last used, prior to the replacement. When one mask pattern is interchanged with a next mask pattern, an area of the one wafer, last exposed to the one mask pattern, is first exposed to the next mask pattern.

78 Claims, 23 Drawing Sheets

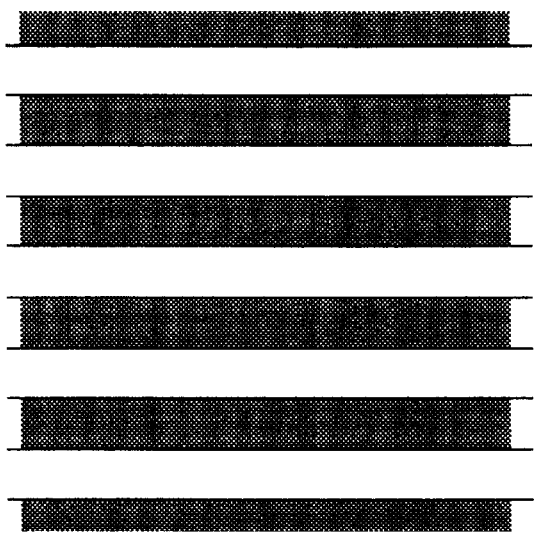
FIG. 2A(1)
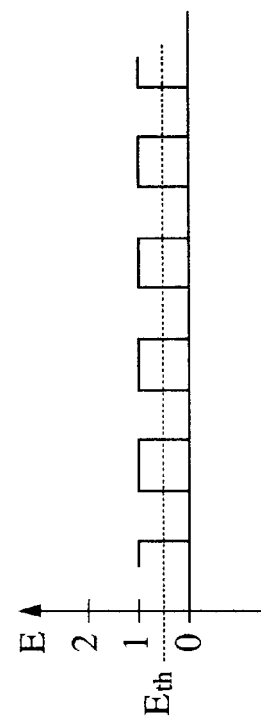
FIG. 2A(2)
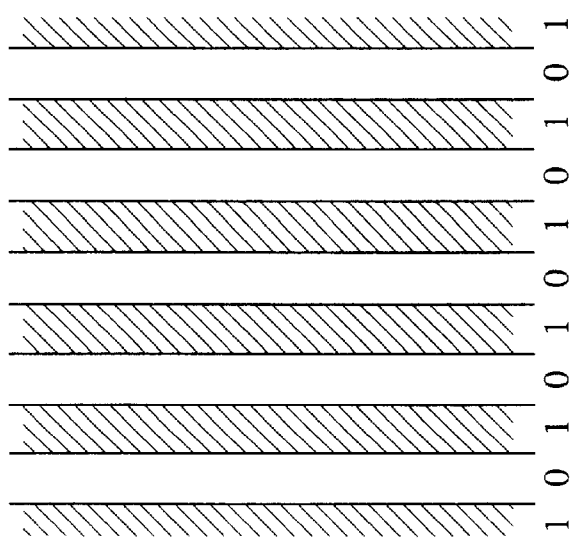
FIG. 2B(1)
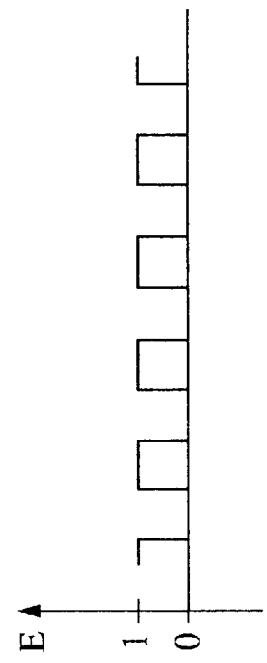
FIG. 2B(2)

NEGATIVE RESIST

POSITIVE RESIST

NEGATIVE RESIST　　　POSITIVE RESIST
FIG. 4A(1)　　　　　　FIG. 4B(1)
EXPOSURE E > $E_{th}$
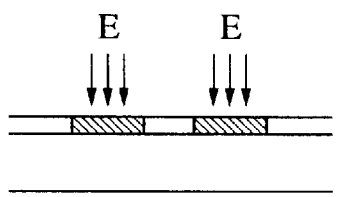
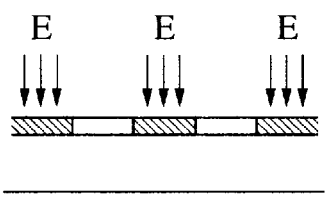
FIG. 4A(2)　　　　　　FIG. 4B(2)
DEVELOPMENT　FILM THICKNESS d AFTER DEVELOPMENT　DEVELOPMENT
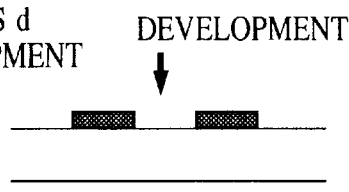
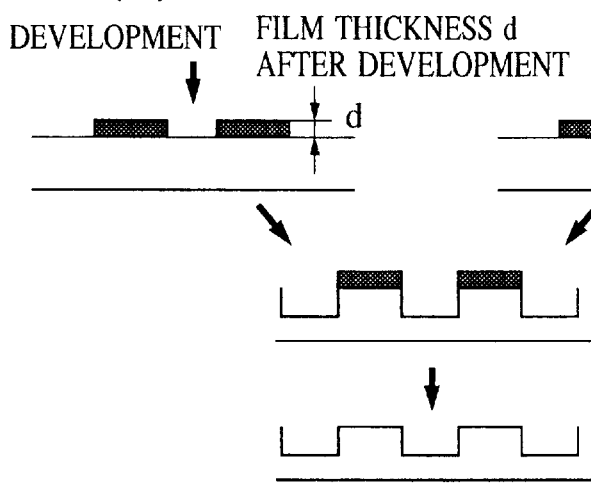
FIG. 4C
FIG. 4D

FIG. 5A
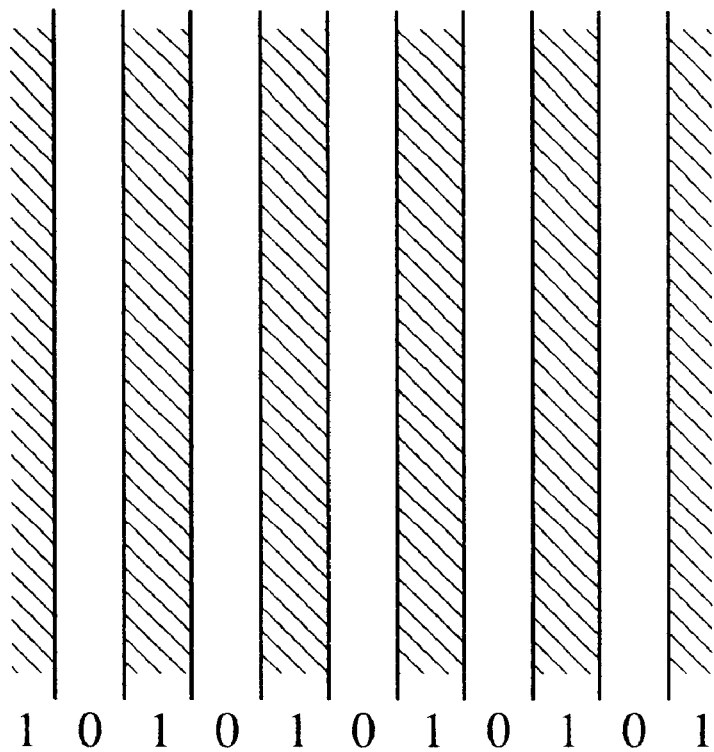
1 0 1 0 1 0 1 0 1 0 1
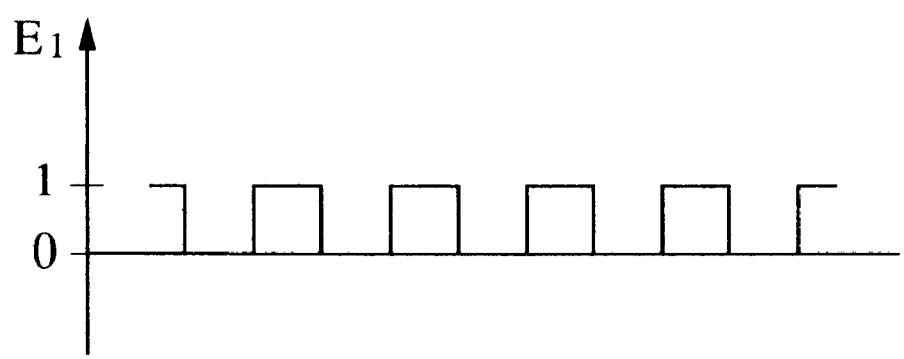
FIG. 5B

FIG. 6A
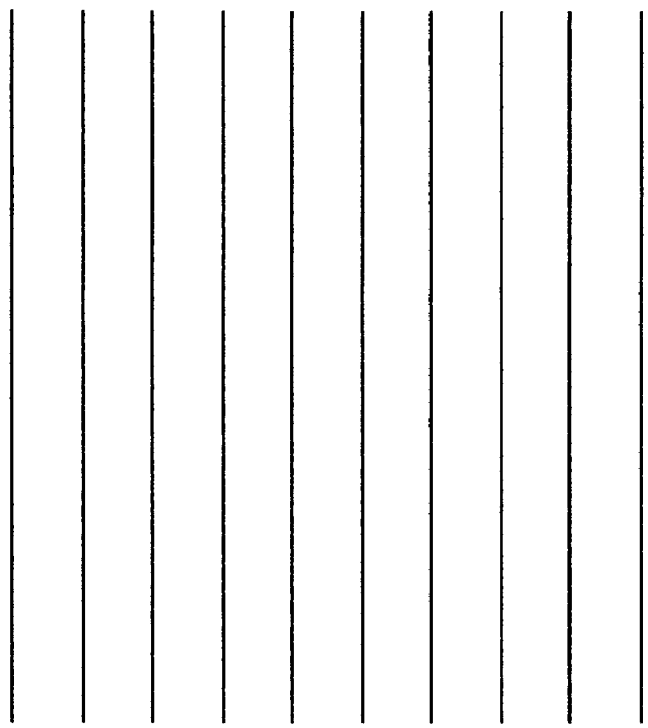
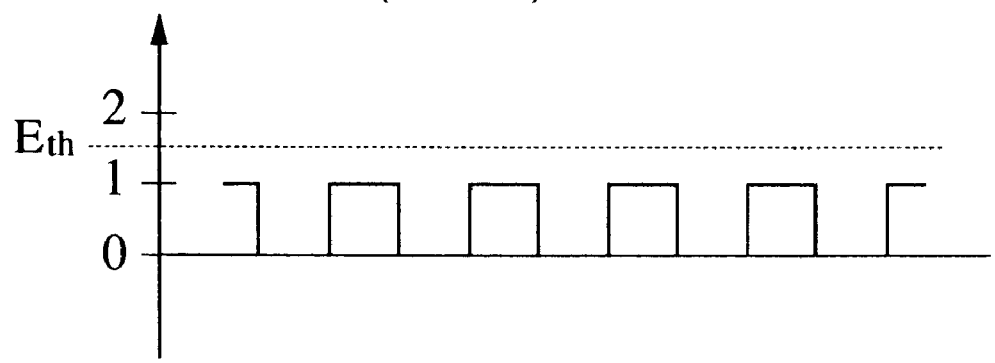
FIG. 6B

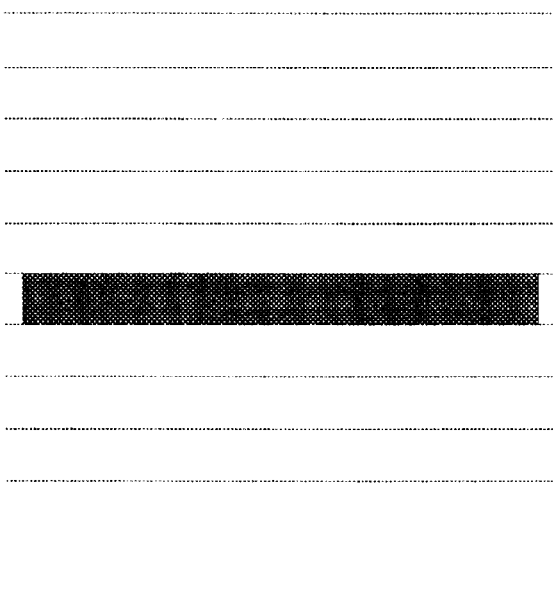
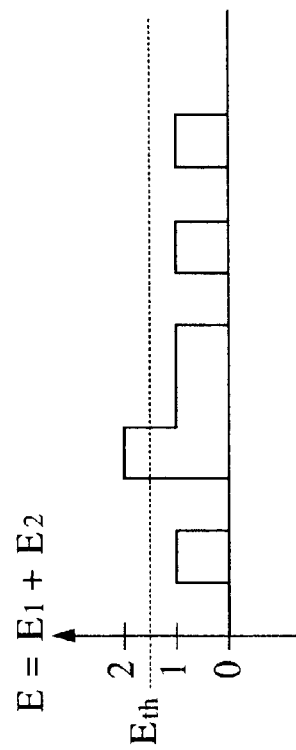
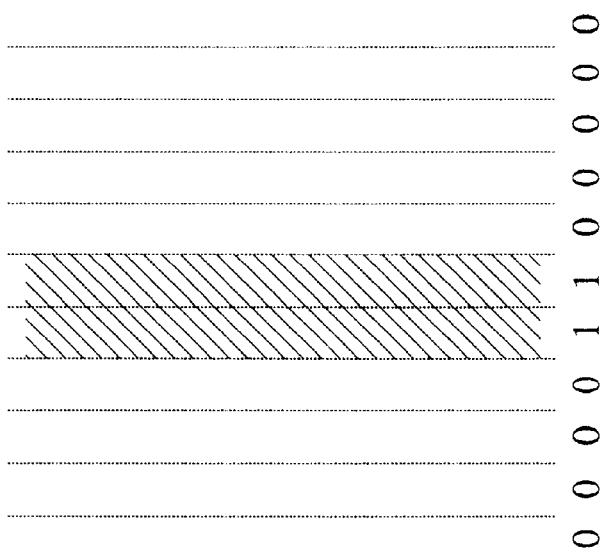
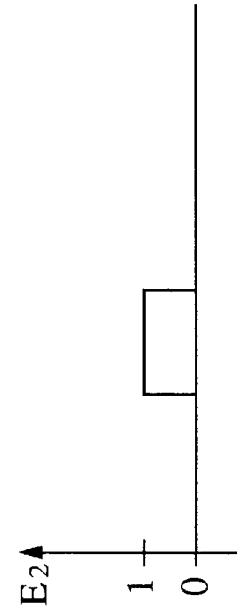

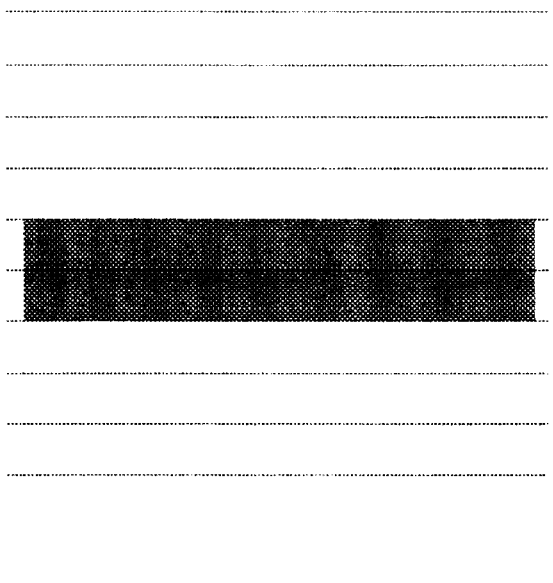
FIG. 8B(1)
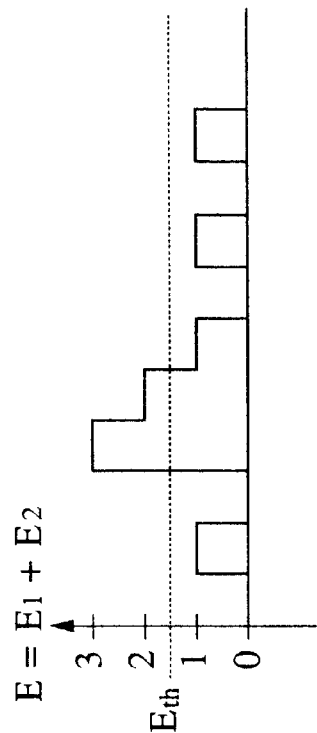
FIG. 8B(2)
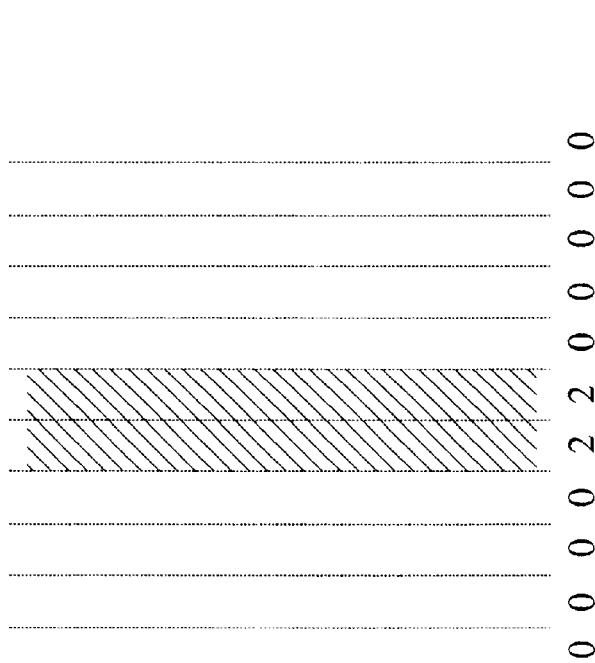
FIG. 8A(1)
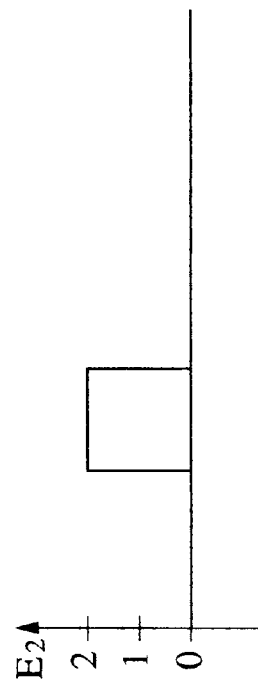
FIG. 8A(2)

FIG. 9B(1)
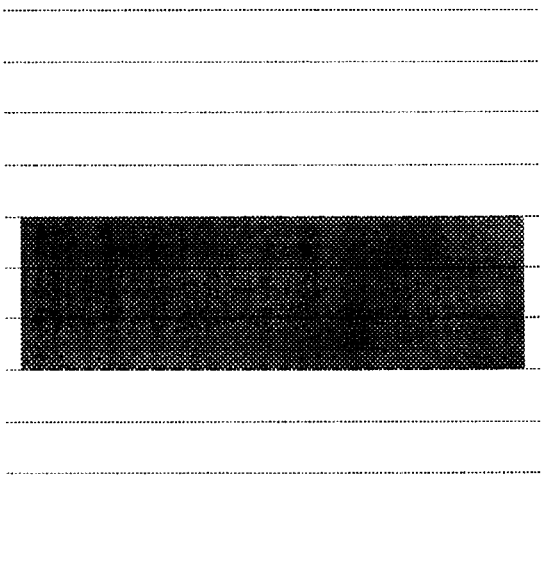
FIG. 9B(2)
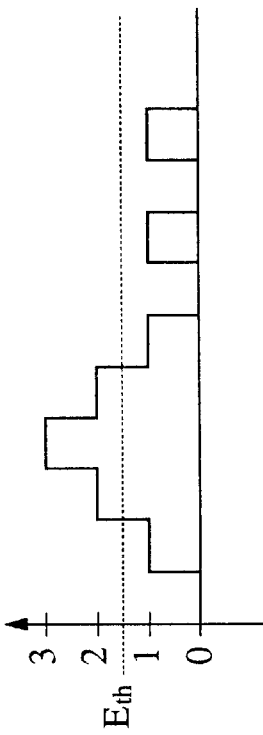
FIG. 9A(1)
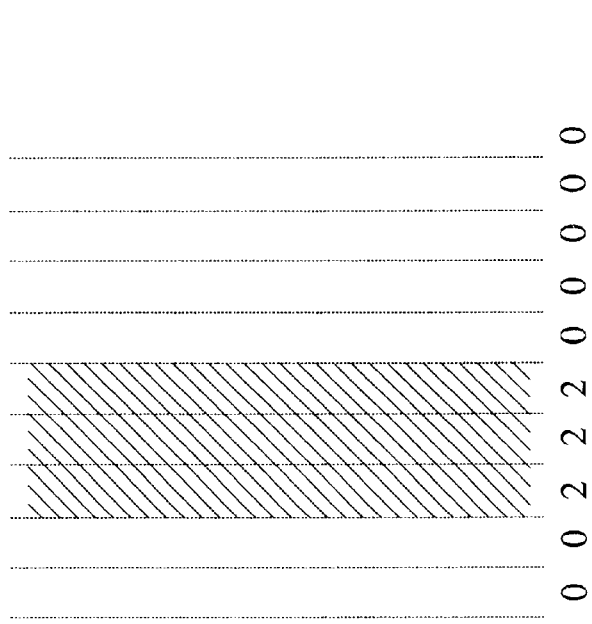
FIG. 9A(2)
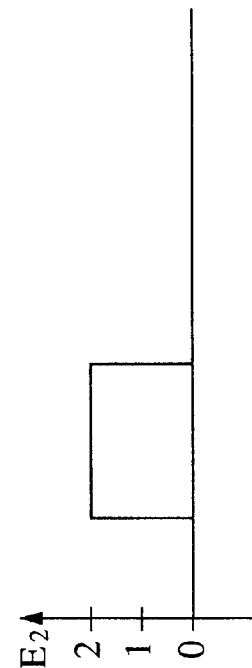

FIG.11A(1)
FIG.11B(1)
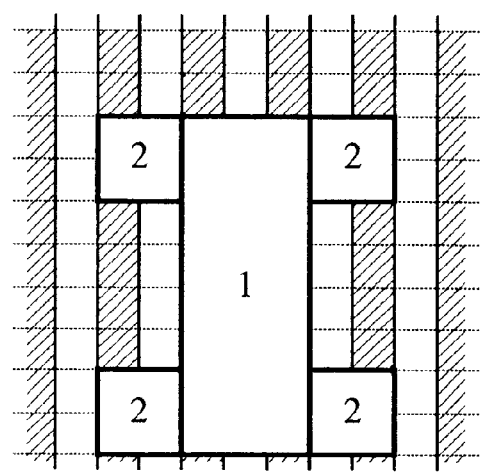
FIG.11A(2)
FIG.11B(2)
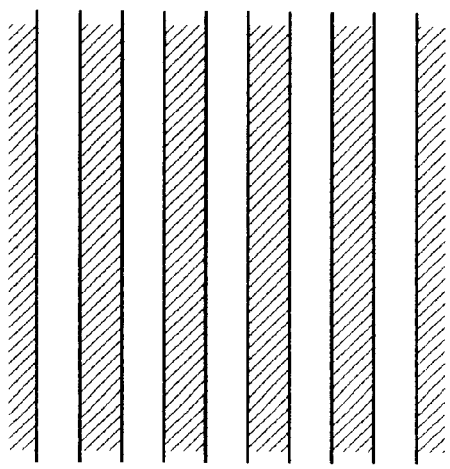

FIG. 11C(1)
| 1 | 0 | 1 | 0 | 1 | 0 | 1 | 0 | 1 | 0 | 1 |
|---|---|---|---|---|---|---|---|---|---|---|
| 1 | 0 | 3 | 2 | 2 | 1 | 2 | 2 | 3 | 0 | 1 |
| 1 | 0 | 3 | 2 | 2 | 1 | 2 | 2 | 3 | 0 | 1 |
| 1 | 0 | 1 | 0 | 2 | 1 | 2 | 0 | 1 | 0 | 1 |
| 1 | 0 | 1 | 0 | 2 | 1 | 2 | 0 | 1 | 0 | 1 |
| 1 | 0 | 1 | 0 | 2 | 1 | 2 | 0 | 1 | 0 | 1 |
| 1 | 0 | 1 | 0 | 2 | 1 | 2 | 0 | 1 | 0 | 1 |
| 1 | 0 | 3 | 2 | 2 | 1 | 2 | 2 | 3 | 0 | 1 |
| 1 | 0 | 3 | 2 | 2 | 1 | 2 | 2 | 3 | 0 | 1 |
| 1 | 0 | 1 | 0 | 1 | 0 | 1 | 0 | 1 | 0 | 1 |
FIG. 11D(1)
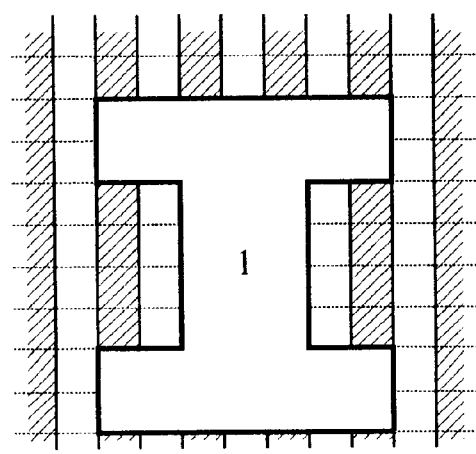
FIG. 11C(2)
| 1 | 0 | 1 | 0 | 1 | 0 | 1 | 0 | 1 | 0 | 1 |
|---|---|---|---|---|---|---|---|---|---|---|
| 1 | 0 | 3 | 2 | 2 | 1 | 2 | 2 | 3 | 0 | 1 |
| 1 | 0 | 3 | 2 | 2 | 1 | 2 | 2 | 3 | 0 | 1 |
| 1 | 0 | 1 | 0 | 2 | 1 | 2 | 0 | 1 | 0 | 1 |
| 1 | 0 | 1 | 0 | 2 | 1 | 2 | 0 | 1 | 0 | 1 |
| 1 | 0 | 1 | 0 | 2 | 1 | 2 | 0 | 1 | 0 | 1 |
| 1 | 0 | 1 | 0 | 2 | 1 | 2 | 0 | 1 | 0 | 1 |
| 1 | 0 | 3 | 2 | 2 | 1 | 2 | 2 | 3 | 0 | 1 |
| 1 | 0 | 3 | 2 | 2 | 1 | 2 | 2 | 3 | 0 | 1 |
| 1 | 0 | 1 | 0 | 1 | 0 | 1 | 0 | 1 | 0 | 1 |
FIG. 11D(2)
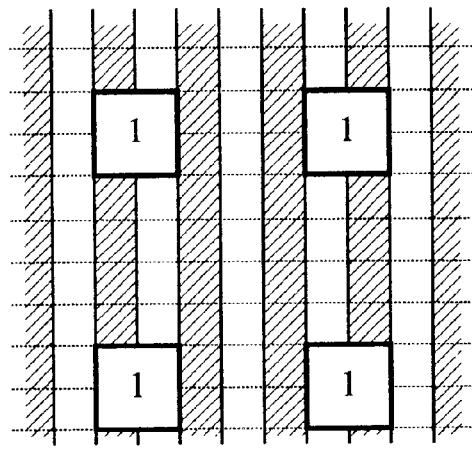

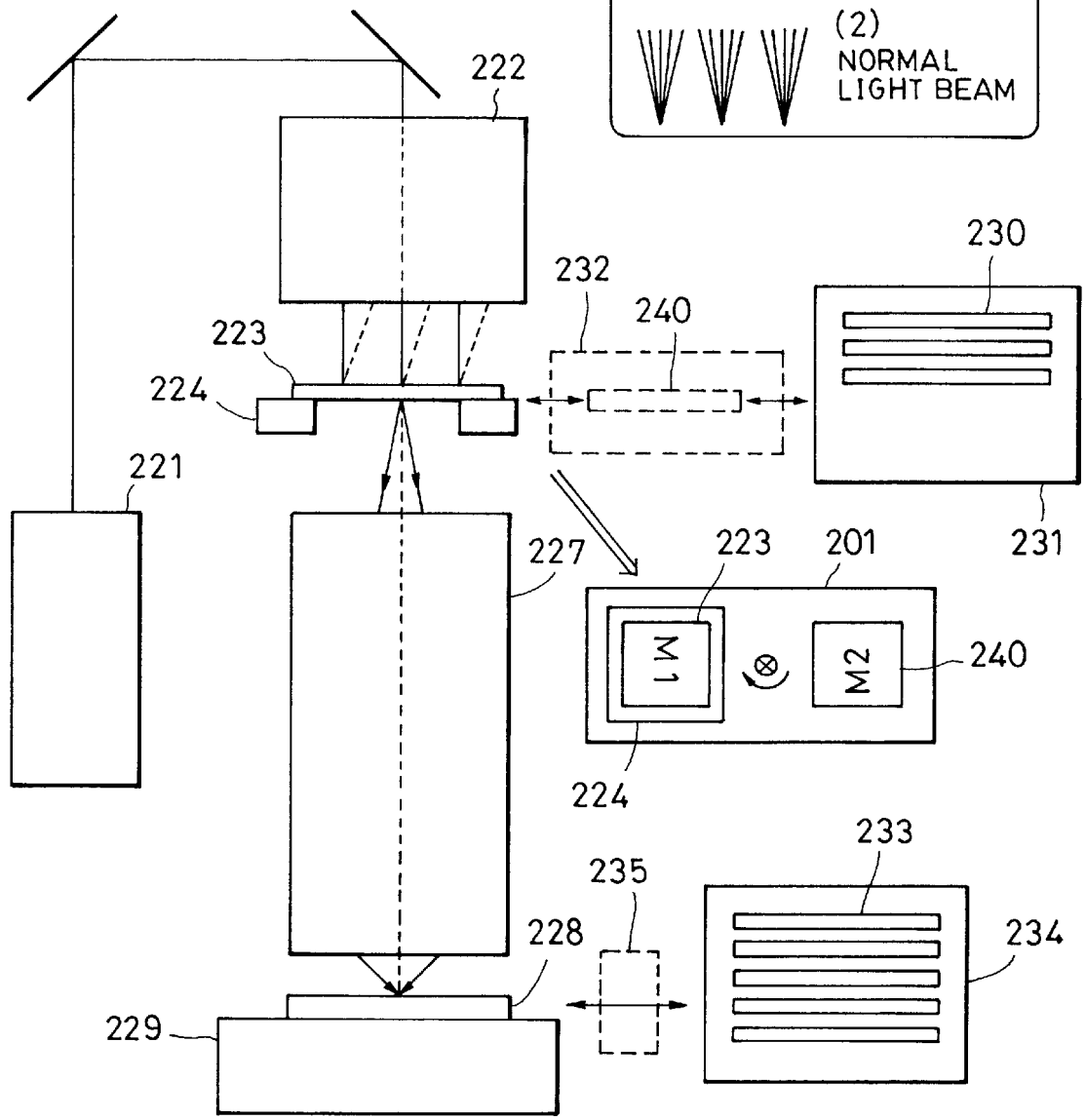
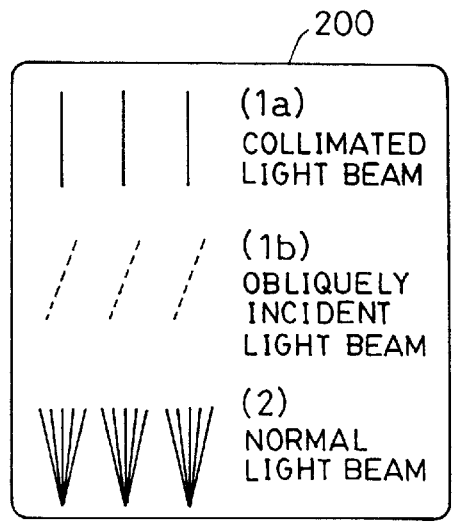
FIG. 15B
FIG. 15A

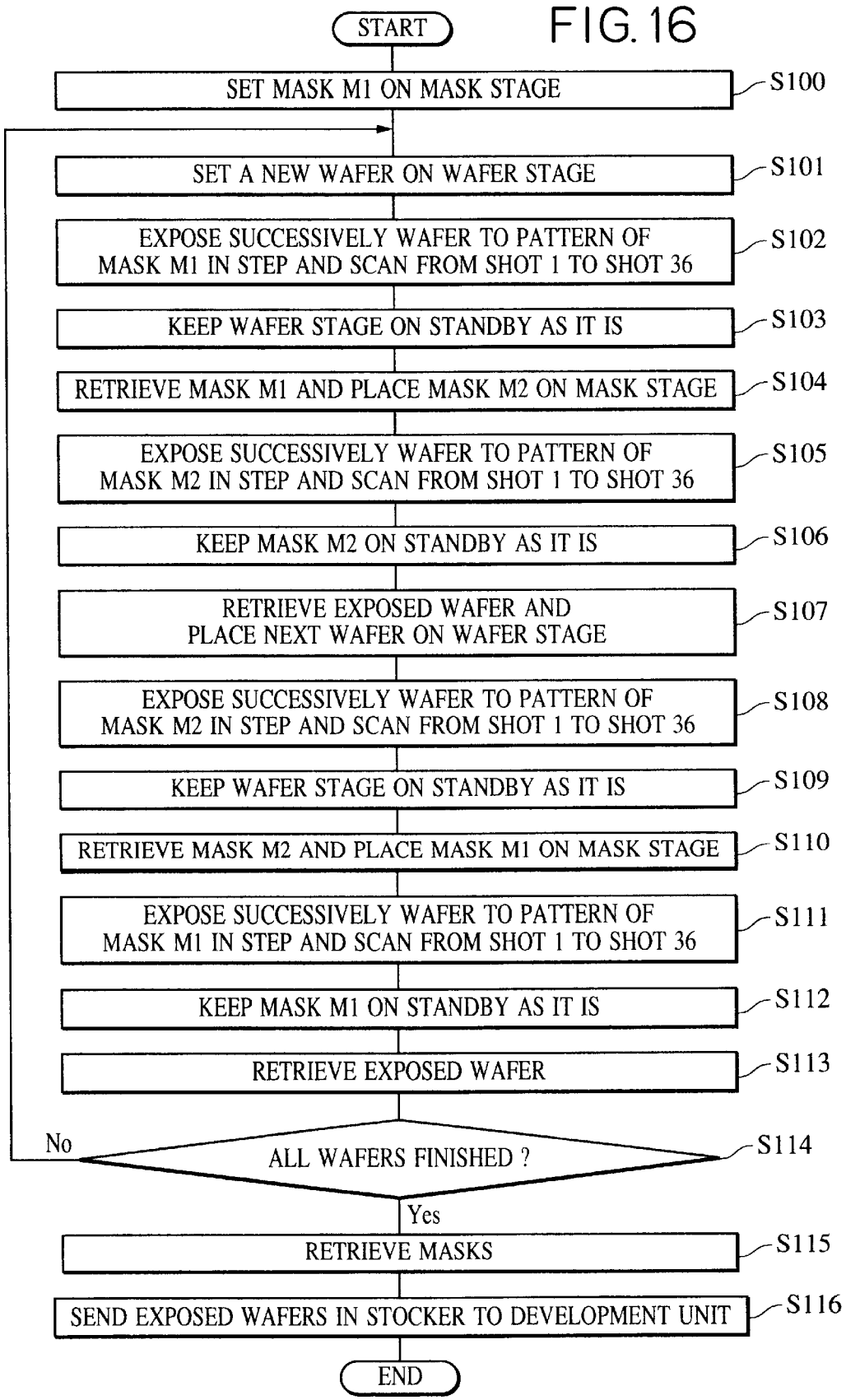

ALIGNING METHOD, ALIGNER, AND DEVICE MANUFACTURING METHOD

BACKGROUND OF THE INVENTION

1. Field of the Invention

The present invention relates to an aligning method and an aligner, and, more particularly, to an aligning method and an aligner for exposing a wafer to a fine circuit pattern. The aligning method and the aligner find applications in the manufacture of a diversity of devices including semiconductor chips such as ICs and LSIs, display devices such as liquid-crystal panels, detector devices such magnetic heads, and image pickup devices such as CCDs.

2. Description of the Related Art

A projection aligning method and a projection aligner have been conventionally used when devices such as ICs, LSIs, and liquid-crystal panels are manufactured using photolithographic techniques. Through its projection optical system, the projection aligner transfers a circuit pattern of a photo mask or reticle (hereinafter simply referred to as a "mask") to a photosensitive-agent-coated substrate being exposed, such as a silicon wafer or glass substrate (hereinafter referred to as a "wafer") on which a photoresist or the like is applied.

As the degree of integration of the devices advances, the resolution requirement for a pattern transferred to a wafer becomes finer, and the area requirement per chip on the wafer increases. Many attempts have been made to meet these ever-increasing requirements.

Available as a technique to increase the resolution is a multiple exposure technique in which a wafer is exposed to a plurality of patterns in an overlapped manner and a portion of the wafer, in which the amount of exposure exceeds the threshold of a resist, is developed. Also available as a technique to enlarge the exposure area is a stitching exposure technique, in which a plurality of patterns are stitched into a wide area for exposure.

In both the multiple exposure technique and the stitching exposure technique, a plurality of exposures are made for the production of a single chip pattern in connection with one layer of a wafer. As the exposure is repeated, the time required to interchange masks and to move the wafer increases, presenting difficulty in improving the throughput (i.e., the output of substrates per unit time) of the aligner.

SUMMARY OF THE INVENTION

It is an object of the present invention to provide an aligning method and an aligner, which are of great use and result in an improved overall throughput in the exposure of a wafer to a plurality of mask patterns. It is another object of the present invention to provide an aligning method and an aligner, which present a fine pattern resolution and a large exposure area, compared to the conventional art, and result in improved throughput. It is yet another object of the present invention to provide a device manufacturing method, based on the aligning method and the aligner of the present invention, for permitting, to be manufactured at a low cost and a high yield, a device having a pattern with a high degree of integration.

In a preferred embodiment of the aligning method of the present invention, a wafer having a plurality of areas is exposed to a plurality of mask patterns with one mask pattern being interchanged with a next mask pattern to perform the exposure on a plurality of wafers with one wafer being replaced with a next wafer. The next wafer is exposed to the one mask pattern being used immediately prior to a replacement, when the one wafer is replaced with the next wafer. An area of the one wafer last exposed to the one mask pattern is first exposed to the next mask pattern, when the one mask pattern is interchanged with the next mask pattern.

A device manufacturing method of the present invention includes the steps of exposing a wafer according to the above aligning method, and developing the wafer subsequent to the exposure.

In a preferred embodiment of the present invention, the aligner includes a mask stage for holding a mask, a wafer stage for holding a wafer, and exposure means for illuminating the mask to expose the wafer. The exposure means exposes a plurality of areas of the wafer to a plurality of masks, with one mask being interchanged with a next mask, to perform the exposure on a plurality of wafers, with one wafer being replaced with a next wafer. When the next wafer on the wafer stage is exposed to the mask, subsequent to the exposure of the one wafer, the next wafer is first exposed to the mask held by the mask stage.

In another preferred embodiment of the present invention, the aligner includes a mask stage for holding a mask, a wafer stage for holding a wafer, and exposure means for illuminating the mask to expose the wafer. The exposure means exposes a plurality of areas of the wafer to a plurality of masks, with one mask being interchanged with a next mask. When one wafer is exposed to the next mask, subsequent to the exposure of the one wafer to the one mask, a last exposed area of the one wafer is first exposed to the next mask.

BRIEF DESCRIPTION OF THE DRAWINGS

FIGS. 2A(1) through 2B(2) are explanatory diagrams illustrating a mask pattern for a two-beam interference exposure;

FIGS. 4A(1) through 4D are explanatory diagrams illustrating the formation of patterns through development;

FIGS. 5A and 5B are explanatory diagrams illustrating an exposure pattern in a standard two-beam interference exposure;

FIGS. 6A and 6B are explanatory diagrams illustrating an exposure pattern in a two-beam interference exposure according to the present invention;

FIGS. 7A(1) through 7B(2) are explanatory diagrams illustrating one example of an exposure pattern (lithographic pattern) formed in a first embodiment of the present invention;

FIGS. 8A(1) through 8B(2) are explanatory diagrams illustrating another example of an exposure pattern (lithographic pattern) formed in the first embodiment of the present invention;

FIGS. 9A(1) through 9B(2) are explanatory diagrams illustrating yet another example of an exposure pattern (lithographic pattern) formed in the first embodiment of the present invention;

FIG. 11A(1) through FIG. 11D(2) are explanatory diagrams illustrating a second embodiment of the present invention;

FIGS. 15A and 15B are diagrammatic views illustrating a projection aligner that performs multiple exposures;

FIG. 16 is a flow diagram illustrating the process of multiple exposures in a step-and-scan sequence;

DESCRIPTION OF THE PREFERRED EMBODIMENTS

Principle of Multiple Exposure

The general principle of multiple exposures implemented in the embodiments of the present invention is discussed before specifically discussing an aligner of the present invention.

Figure 1:
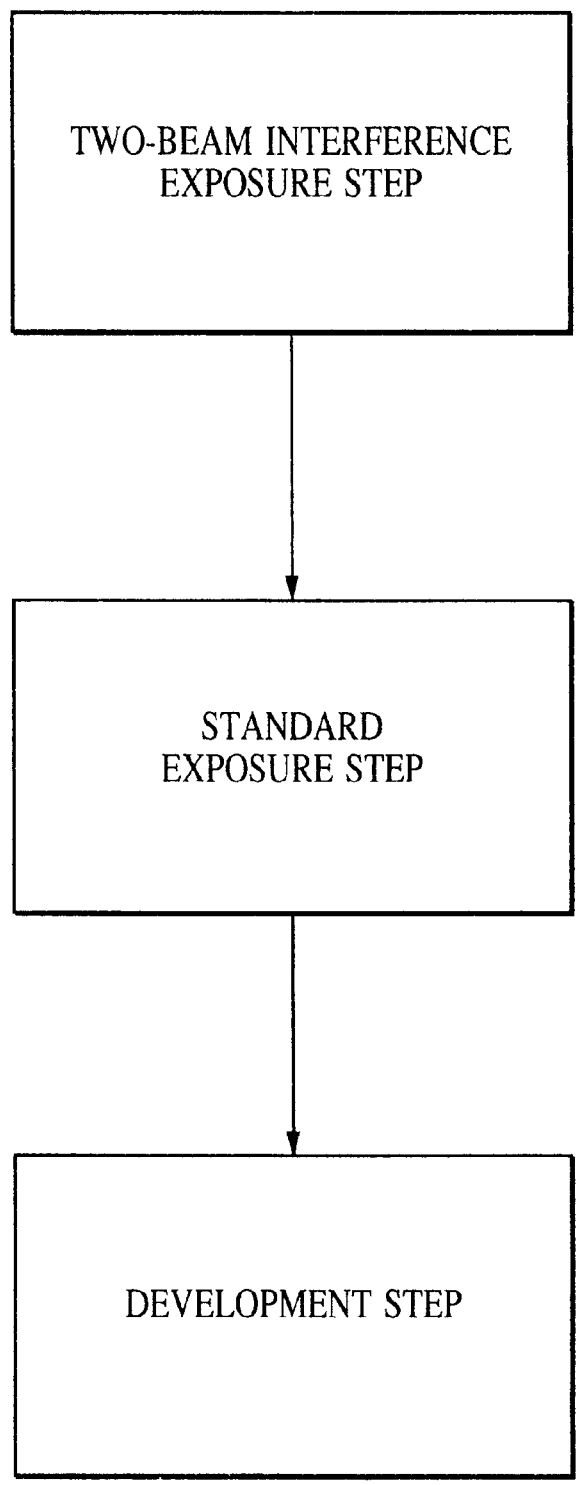
FIG. 1 is a flow diagram showing the process of multiple exposures.

FIG. 1 is a flow diagram showing a multiple exposure method. The multiple exposure method includes three major steps, which include (i) a two-beam interference exposure step using a first mask pattern, (ii) a projection exposure step (standard exposure step) using a second mask pattern, and (iii) a development step carried out subsequent to the multiple exposures of the first two major steps. The order of the two-beam interference exposure step and the standard projection exposure step may be reversed to that shown in FIG. 1. If each major step includes a plurality of steps, the two major steps may be alternately carried out. Although a precise aligning step and other steps are included between the first two major steps, they are not shown in FIG. 1.

When the exposure is performed in accordance with the process flow shown in FIG. 1, the resist applied on the wafer (substrate to be exposed) is exposed to a periodic pattern shown in FIG. 2A(1) and FIG. 2B(1) through the two-beam interference exposure. The numbers shown in FIG. 2A(1) and FIG. 2B(1) represent the amount of exposure. Referring to FIGS. 2A(1) and 2A(2), the exposure amount in the hatched areas is 1 (any level in practice), and the exposure amount in the blank areas is 0.

When the wafer is developed (subsequent to the exposure of the wafer to the periodic pattern only), the exposure threshold value $E_{th}$ of the resist of the wafer, namely, a photosensitive substrate, is set between the exposure levels 1 and 0 as shown in FIG. 2B(2). Shown in FIG. 2B(1) is a finally obtained lithographic pattern (irregularity pattern).

Figure 3A:
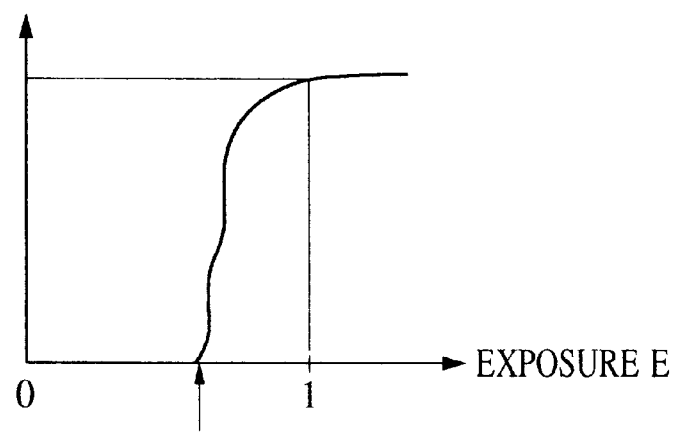
FIG. 3A and FIG. 3B are explanatory diagrams illustrating the sensitivity characteristics of a resist to exposure.
Figure 3B:
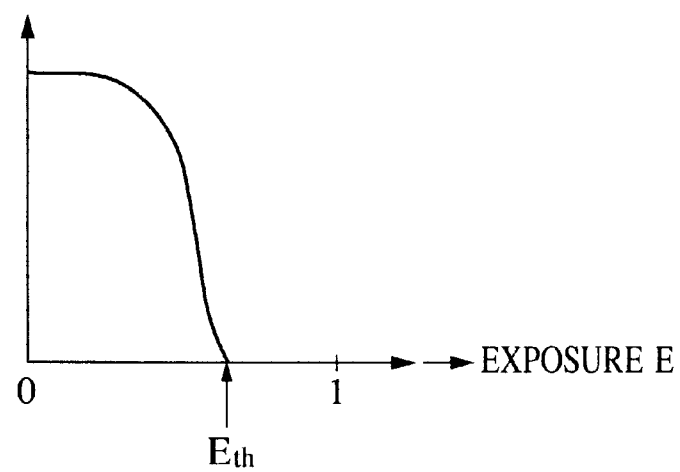

FIG. 3A shows the dependency of the thickness of a negative resist subsequent to development on the exposure amount and the exposure threshold value of the negative resist, and FIG. 3B shows the dependency of the thickness of a positive resist subsequent to development on the exposure amount and the exposure threshold value of the positive resist. In the positive resist, its thickness becomes zero after development when the exposure level is equal to or higher than the exposure threshold value. In the negative resist, its thickness becomes zero after development when the exposure level is equal to or lower than the exposure threshold value.

FIG. 4A(1) through FIG. 4D illustrate lithographic patterns that are formed through a development and etching process subsequent to exposure, in connection with the negative resist and the positive resist, respectively.

Different from a standard sensitivity setting of the resist to exposure, in this embodiment, the exposure threshold value $E_{th}$ of the resist of the wafer is set to be higher than 1 as shown in FIG. 5A and FIG. 5B (identical to FIG. 2A(1) and FIG. 2A(2)) and in FIG. 6 when the maximum exposure level in the two-beam interference exposure is set to be 1. When the exposure pattern (exposure distribution), based on the two-beam interference exposure only as shown in FIG. 2A(1) and FIG. 2B(1), is developed, the wafer lacks the exposure level and no zero thickness portion occurs in the resist through development, although the thickness slightly varies. No lithographic pattern is thus formed through the etching process. This is considered to be the disappearance of the two-beam interference exposure pattern. (Although the present invention is discussed in connection with the negative resist, the present invention can also be implemented using a positive resist.) A lithographic pattern is shown in FIG. 6A (no pattern is formed), and the relationship between an exposure distribution and an exposure threshold value is shown in FIG. 6B. In FIG. 6B, $E_1$ represents the amount of exposure in the two-beam interference exposure and $E_2$ represents the amount of exposure in the standard projection exposure.

The feature of the embodiment lies in that a high-resolution exposure pattern, which is apparently missing if only the two-beam interference exposure is performed, is combined with an exposure pattern from the standard projection exposure to selectively expose a desired portion only at an exposure level higher than the exposure threshold value of the resist, to create a desired photolithographic pattern.

FIG. 7A(1) shows an exposure pattern in the standard projection exposure. Since the resolution of the standard projection exposure is approximately half as fine as the resolution of the two-beam interference exposure in this embodiment, the line width of the exposure pattern in the standard projection exposure is approximately twice as wide as that of the exposure pattern in the two-beam interference exposure.

When the projection exposure to create the exposure pattern shown in FIG. 7A(1) is made on the same area on the same resist on the wafer in an overlapped manner in succession to the two-beam interference exposure shown in FIG. 5A with the development step being skipped, the overall exposure distribution on the resist is obtained as shown in the graph in FIG. 7B(2). The ratio of the amount of exposure $E_1$ in the two-beam interference exposure to the amount of exposure $E_2$ of the standard projection exposure is 1:1, and the exposure threshold value $E_{th}$ is set between the amount of exposure $E_1$ (=1) and the sum (=2) of the amount of exposure $E_1$ and the amount of exposure $E_2$ in the standard projection exposure. A lithographic pattern shown in FIG. 7B(1) is thus created. The isolated line pattern shown in FIG. 7B(1) has the resolution of the two-beam interference exposure but is not periodic. Therefore, a high-resolution pattern higher than that feasible in the standard projection exposure is thus obtained.

When the projection exposure to create the exposure patterns shown in FIG. 8A(1) and FIG. 8B(1) (the standard projection exposure having a line width twice as wide as the exposure pattern shown in FIG. 5A and higher than the exposure threshold value (twice as high as the exposure threshold value)), is made on the same area on the same resist on the wafer in an overlapped manner in succession to the two-beam interference exposure shown in FIG. 5A with the development step being skipped, the overall exposure distribution on the resist is obtained as shown in the graph in FIG. 8B(2). That is, the exposure pattern of the two-beam interference exposure disappears, and only the lithographic pattern from the standard projection exposure is created.

The above principle also works in the case shown in FIG. 9A(1) and FIG. 9B(1), in which the projection exposure is performed using a line width three times as wide as the exposure pattern shown in FIG. 5A. (An exposure pattern being four or more times as wide as the exposure pattern shown in FIG. 5A can be obtained by combining the exposure pattern being twice as wide and the exposure pattern being three times as wide, for example.) All lithographic patterns achieved by the projection exposure are also formed by this embodiment.

By adjusting the exposure distribution (i.e., the absolute value and the distribution of the exposure) and the threshold value of the resist on the wafer in each of the above-discussed two-beam interference exposure and standard projection exposure methods, the aligner forms a circuit pattern having the resolution (shown in FIG. 7B(1)) of the two-beam interference exposure as its minimum line width and in a variety of patterns shown in FIG. 6A, FIG. 7B(1), FIG. 8B(1), and FIG. 9B(1).

The principle of the aligning method is now summarized as follows:

(1) The pattern area not projection exposed, namely, a two-beam interference exposure pattern equal to or lower than the exposure threshold value of the resist, disappears through the development process.

(2) As for the pattern area in the standard projection exposure exposed at the exposure equal to or lower than the exposure threshold value of the resist, the exposure pattern having the resolution of the two-beam interference exposure and determined by the standard projection exposure and the two-beam interference exposure is created.

(3) As for the pattern area in the standard projection exposure exposed above the exposure threshold value, a fine pattern, which might be otherwise undeveloped by performing only the standard projection exposure, is formed in the same manner (corresponding to the mask). A further advantage of this aligning method is that a portion having the highest resolution by the two-beam interference exposure offers a depth of focus substantially larger than that in the standard projection exposure.

Another example is now discussed. The circuit pattern (lithographic pattern) obtained here through the exposure is a gate pattern as shown in FIG. 10.

Figure 10:
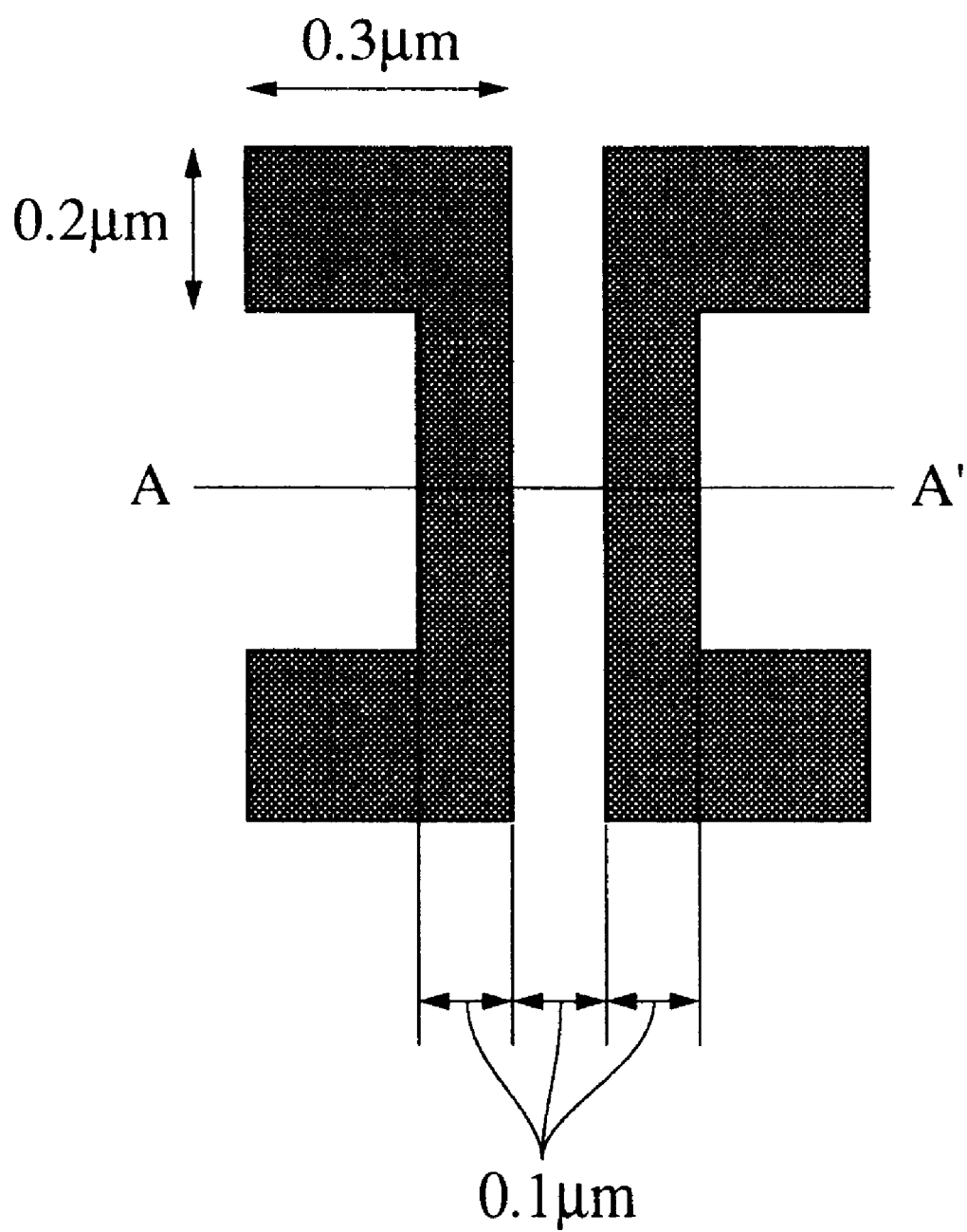
FIG. 10 is an explanatory diagram illustrating a gate pattern.

The gate pattern shown in FIG. 10 has a minimum line width of 0.1 μm across, namely along a ling A–A', and has a line width of 0.2 μm or longer in a vertical direction. In such a two-dimensional pattern requiring a high resolution in one dimension only, the two-beam interference exposure is simply performed on that one dimension.

FIG. 11A(1) through FIG. 11D(2) show combinations of the two-beam interference exposure and the standard projection exposure in one dimension only. FIG. 11A(1) shows a periodic exposure pattern by the two-beam interference exposure in one dimension only. The period of the exposure pattern is 0.2 μm, and corresponds to a line width of 0.1 μm L & S (line and space). The numbers in the figures represent the exposure amount.

Figure 12:
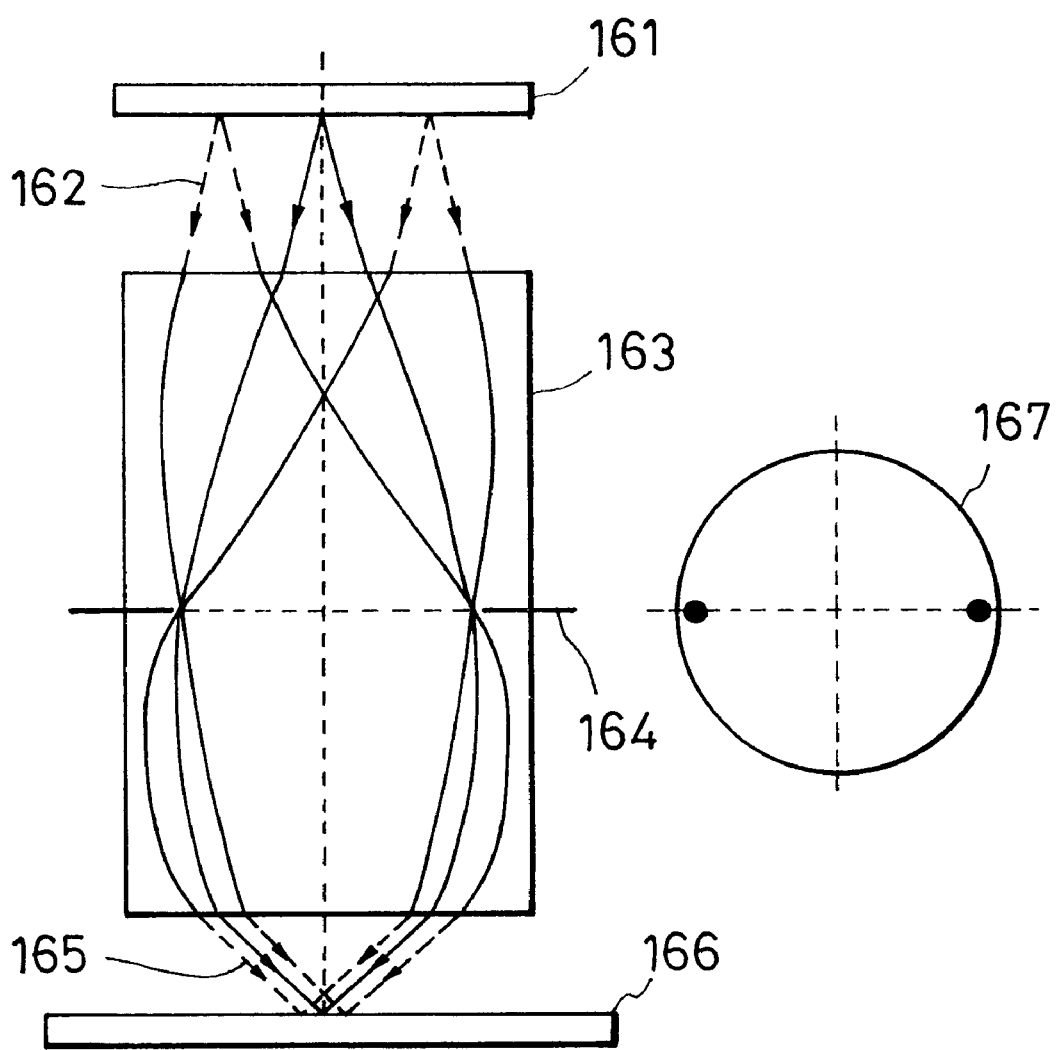
FIG. 12 is a diagrammatic view illustrating an aligning method that performs a two-beam interference exposure.

The two-beam interference exposure is performed using a projection aligning method shown in FIG. 12 and masks and illumination methods shown in FIG. 13A, FIG. 13B, FIG. 13C, FIG. 14A and FIG. 14B.

FIG. 12 shows a projection aligning method using a reduction projection optical system (constructed of a number of lens elements), which presents an NA of 0.6 or greater at an exposure light wavelength of 248 nm (e.g., a KrF excimer laser). Referring to FIG. 12, there are shown a mask 161, an object-side exposing light beam 162 exiting from the mask 161 and incident on a projection optical system 163, the projection optical system 163, an aperture stop 164, an image-side exposing light beam 165 exiting from the projection optical system 163 and incident on a wafer 166, the wafer 166 as a substrate being exposed, and a pair of black spots 167 representing the positions of the luminous fluxes on a pupillary surface corresponding to a circular opening of the aperture stop 164. FIG. 12 shows a projection optical system 163 that performs the two-beam interference exposure, and each of the object-side exposing light beam 162 and the image-side exposing light beam 165 is constructed of two collimated luminous fluxes.

The mask and its illumination method are arranged as one of the settings shown in FIG. 13A, FIG. 13B, FIG. 13C, FIG. 14A and FIG. 14B to carry out the two-beam interference exposure. The three settings are discussed.

Figures 13A, 13B, 13C:
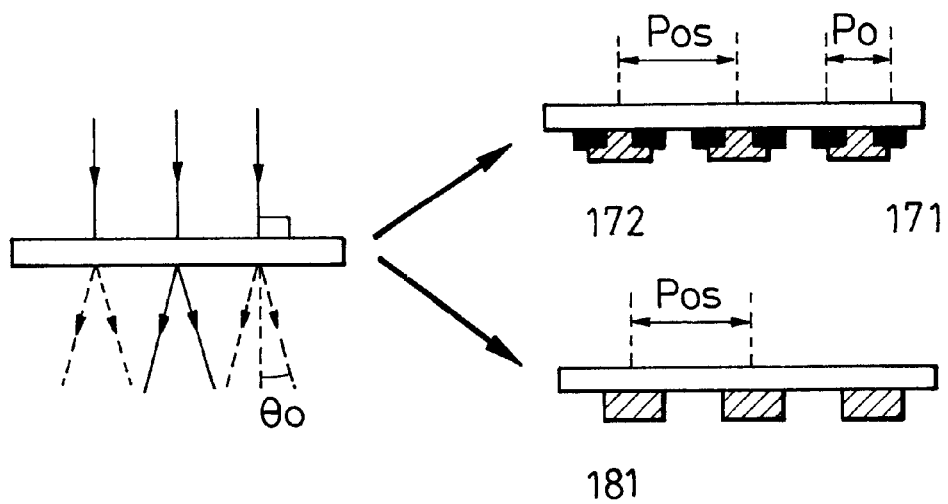
FIG. 13A, FIG. 13B and FIG. 13C are explanatory diagrams illustrating one example of a mask and an illumination method used in the aligner illustrated in FIG. 12.

FIGS. 13A and 13B show a Levenson-type phase shift mask. The pitch $P_0$ of a light shield 171 made of chromium is expressed by Equation (1), and the pitch $P_{OS}$ of a phase shifter 172 is expressed by Equation (2):

$$P_0 = MP = 2MR = M\lambda/(2NA) \quad (1)$$

$$P_{OS} = 2P_0 = M\lambda/(NA) \quad (2)$$

where M represents the magnification of a projection optical system 163, λ represents the wavelength of an exposure light beam, and NA represents the numerical aperture of the projection optical system 163 at its image side.

The mask shown in FIG. 13C is a shifter edge type phase shift mask made of chromium having no light shield, and the pitch $P_{OS}$ of a phase shifter 181 satisfies Equation (2) discussed above with respect to the Levenson type phase shift mask.

To perform the two-beam interference exposure using the phase shift masks shown in FIG. 13A, FIG. 13B, and FIG. 13C, theses masks are illuminated with a so-called coherent light beam with σ=0 (or nearly 0). Specifically, a collimated luminous flux is directed onto the mask surface at a right angle (in a direction parallel to the optical axis), as shown in FIG. 13A. Under such an illumination, zero order transmitted diffracted light beams exiting in a direction perpendicular to the mask cancel out each other through the phase shifter with the phase difference between adjacent transmitted light beams being π. Referring back to FIG. 12, two collimated luminous fluxes of ±1st order transmitted diffracted light beams are symmetrically produced with respect to the optical axis of the projection optical system 163 from the mask 161, and two object-side exposure light beams interfere with each other on the wafer. Second or higher order diffracted light beams are not introduced into the aperture of the aperture stop 164, and do not contribute to the imaging on the wafer 166.

Figures 14A, 14B:
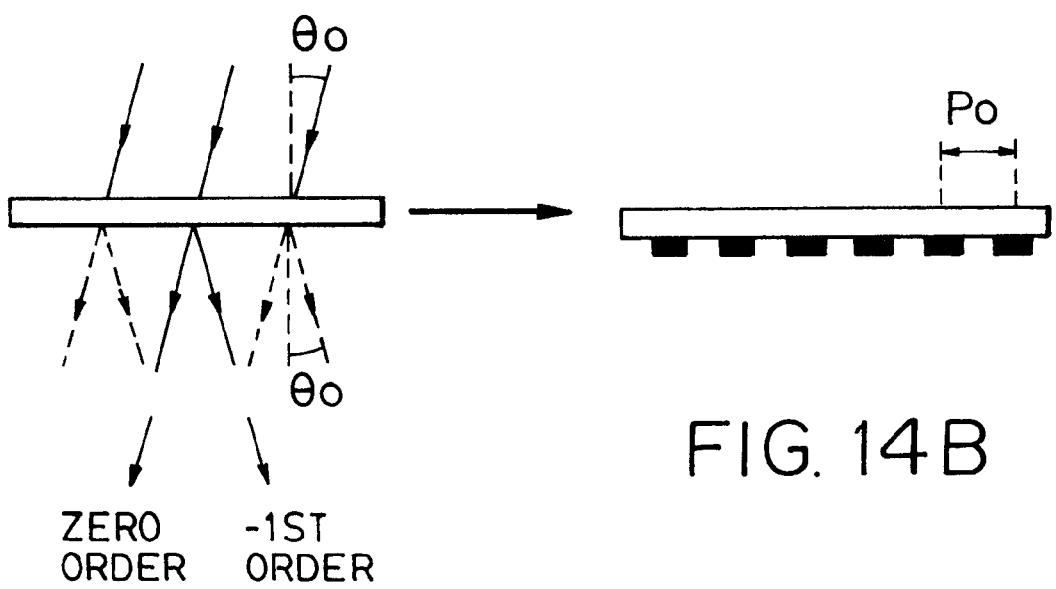
FIGS. 14A and 14B are explanatory diagrams illustrating another example of a mask and an illumination method used in the aligner illustrated in FIG. 12.

The pitch $P_0$ of the mask shown in FIG. 14A and FIG. 14B is expressed by Equation (3), which is identical to Equation (1):

$$P_0=MP=2MR=M\lambda/(2NA) \quad (3)$$

where M represents the magnification of the projection optical system 163, λ represents the wavelength of the exposure light beam, and NA represents the numerical aperture of the projection optical system 163 at its image side.

A single luminous flux or two collimated luminous fluxes are obliquely incident on the mask without any phase shifter, as shown in FIG. 14A. The angle $\theta_0$ of incidence of the collimated luminous fluxes is set to satisfy Equation (4):

$$\sin \theta_0 = M/NA \quad (4)$$

where M represents the magnification of the projection optical system 163, and NA represents the numerical aperture of the projection optical system 163 at its image side.

When the collimated luminous fluxes satisfying Equation (4) are obliquely incident on the mask having no phase shifter, as shown in FIG. 14A, two object-side exposure light beams 162 shown in FIG. 12 take place, namely, a zero order diffracted light beam traveling at an angle of $\theta_0$ with respect to the optical axis, and −1st order diffracted light beams traveling in a light path that is symmetrical to the light path of the zero order diffracted light beams with respect to the optical path of the projection optical system (namely, at an angle of $-\theta_0$ with respect to the optical path). These two luminous fluxes are incident on the aperture of the aperture stop 164 in the projection optical system 163, forming an image on the wafer.

In the present invention, the obliquely incident single or double collimated luminous fluxes are treated as "coherent illumination".

The method of using the two-beam interference exposure using the mask has been discussed. The illumination optical system of typical projection aligners is normally designed to perform partial coherent illumination. The projection aligner is modified to work on a virtually coherent illumination by replacing the aperture stop of the illumination optical system featuring 0<σ<1 with a special aperture stop featuring a approximately equal to 0.

Returning to FIG. 10 and FIGS. 11A(1) through 11D(2), the second embodiment is further discussed. In the second embodiment, through the standard projection exposure subsequent to the two-beam interference exposure discussed above, the wafer is exposed to the pattern of the side-down letter H shown in FIG. 11B(1), for example. Shown in FIG. 11B(1) are exposure amounts at five areas through the exposure pattern of the two-beam interference exposure and the exposure pattern of the standard projection exposure. Shown in FIG. 11B(2) are exposure amounts to the resist of the wafer through the standard projection exposure in a map of a resolution of vertical and horizontal pitches of 0.1 μm.

The line width of the exposure pattern in the projection exposure is 0.2 μm, namely twice as wide as that of the two-beam interference exposure. Available as the projection exposure method for providing a multi-value exposure distribution having different exposures depending on the area (multi-value because there are three exposure amounts of 0, 1, and 3) is the use of a special mask having multiple transmittances. The special mask has T% as the transmittance of the aperture of the mask corresponding to the areas represented by 1, and 2T% as the transmittance of the aperture of the mask corresponding to the areas represented by 2. In this method, the projection exposure is completed by one exposure flow. The exposure amount ratio of the special mask on the wafer, namely, the two-beam interference exposure: projection exposure in the transmittance of T% at the aperture: projection exposure in the transmittance of 2T% at the aperture is 1:1:2.

Another method to perform the projection exposure to result in different exposure amounts depending on the area is to sequentially perform exposure using two types of masks for exposure patterns as shown in FIGS. 11D(1) and 11D(2). Since the single value exposure amount through each mask works in this case, the aperture of the mask having a single transmittance also works. The exposure amount ratio on the wafer, namely, the two-beam interference exposure: a first projection exposure: a second projection exposure, is 1:1:1.

Discussed next is the formation of the fine circuit pattern shown in FIG. 10 through the above-mentioned combination of the two-beam interference exposure and the projection exposure. In this embodiment, no development step is included between the two-beam interference exposure and the standard projection exposure. Where exposure patterns overlapped through exposure steps, the exposure amounts in overlapped areas are added, and the exposure amounts (distribution) subsequent to the addition results in a new exposure pattern.

FIG. 11C(1) shows an exposure distribution (exposure pattern) resulting from the addition of the exposure amounts from the exposure pattern shown in FIG. 11A(1) and the exposure pattern shown in FIG. 11B(1). The shadow areas shown in FIG. 11C(2) are a pattern resulting from the development of the exposure pattern shown in FIG. 11C(1). Since the resist in the wafer in this embodiment has an exposure threshold higher than 1 but lower than 2, the areas having an exposure amount greater than 1 are developed as a resulting pattern. The shadow areas shown in FIG. 11C(2) agree with the gate pattern shown in FIG. 10 in configuration and dimension. Through the aligning method of this embodiment, a circuit pattern having a fine line width equal to or narrower than 0.15 μm (0.1 μm, for example) is formed using a projection aligner having an illumination optical system having the capability to switch between partial coherent illumination and coherent illumination.

Embodiments of Aligner

FIG. 15A is a diagrammatic view of a high-resolution aligner that operates on the principle of the multiple exposure by performing both the two-beam interference exposure and the projection exposure.

Referring to FIGS. 15A and 15B, there are shown an exposure light source 221 (e.g., a KrF excimer laser, an ArF excimer laser, or an F2 laser), and an illumination optical system 222 having a masking blade for defining an illumination area. Also shown are a mask (reticle) 223, a mask stage 224 which holds the mask 223, while being moved to perform scanning, and a projection optical system 227 for projecting a reduced image of a circuit pattern of the mask 223 onto a wafer 228. A step-and-scan wafer stage 229 is movable in a plane (X and Y directions) perpendicular to the optical axis of the projection optical system 227 and in the direction of the optical axis (Z direction). The position of the wafer stage 229 is precisely controlled using a laser interferometer. The projection aligner also includes an unshown mask aligning optical system, and an unshown wafer aligning optical system. The wafer aligning optical system is available in any type of off-axis aligning optical system, TTL aligning optical system, TTR aligning optical system or the like.

Designated 230 is a mask changer having a mask stocker for storing a plurality of masks. The mask changer 230 stores, in the stocker, a plurality of masks supplied from an unshown reticle library. For example, for multiple exposures, a standard mask, the above-mentioned Levenson type phase shift mask, an edge shifter type mask, and a periodic pattern mask having no phase shifter are stored in the stocker. A mask feed mechanism 232 has a standby position where the mask is temporarily placed prior to being fed to the mask stage 224. The mask feed mechanism 232 also includes a handling mechanism for transporting the mask back and forth between the mask stocker and the standby position and between the standby position and the mask stage 224. A mechanism for mask transportation between the standby position and the mask stage retrieves one mask while feeding another substantially at the same time for a quick mask interchange, and can be a rotary mechanism 201, for example, which holds a mask M1 and a mask M2 at the same time and changes the mask position by rotation, as shown in FIG. 15A. The mask feed mechanism 232 selectively picks up any mask from the stocker 231, feeds it to the mask stage 224 via the standby position 240, and retrieves a used mask and feeds it into the stocker 231 via the standby position 240.

A wafer changer 234 includes a wafer stocker for storing a plurality of wafers 233. A wafer feed mechanism 235 includes a handling mechanism for transporting back and forth the wafer 233 between the wafer stocker and the wafer stage 229. The wafer feed mechanism 235 picks up any wafer from the wafer stocker, feeds it to the wafer stage 229, and retrieves an exposed wafer and feeds it into the wafer stocker.

An illumination optical system 222 is designed to switch between partial coherent illumination and coherent illumination. In coherent illumination, a collimated light beam (1*a*) and an obliquely incident light beam (1*b*) shown in a block 200 in FIG. 15B are directed to one of the above-mentioned Levenson type phase shift mask, the edge shifter type phase shift mask, and the periodic pattern having no phase shifter. In the partial coherent illumination, a normal light beam (2) shown in the block 200 is directed to a desired mask. To switch from partial coherent illumination to coherent illumination, the aperture stop placed immediately after a fly's-eye lens in the illumination optical system 222 is interchanged with a coherent illumination aperture stop having a diameter sufficiently smaller than that of the aperture stop for the partial illumination.

The operation of the projection aligner thus constructed is now discussed. The present invention applies to a step-and-scan operational sequence in this embodiment, but equally applies to a step-and-repeat operational sequence in which exposures are performed onto a single shot area at one time.

The step-and-scan operational sequence basically repeats a step operation in which the wafer stage is moved in the X direction or Y direction to position a shot area for exposure, and a scan operation in which the wafer is exposed while being scanned with the mask stage and the wafer stage being moved in synchronization. In the scan operation, the mask stage and the wafer stage are moved at constant speeds in a predetermined speed ratio synchronization (e.g., 4:1 in this embodiment), relative to an illuminating light beam having a slit shape in cross section and a projection optical system. One shot area of the wafer is exposed to the entire pattern of the mask for mask transfer.

FIG. 16 is a flow diagram showing the multiple exposures performed in the step-and-scan sequence. Two types of masks for one layer are used in which the mask M1 is a pattern for the two-beam interference exposure and the mask M2 is an isolated pattern for the standard projection exposure. One or more chip patterns are formed in a single shot area.

The mask M1 is picked up from the stocker and is set on the mask stage (step S100). At the same time, a resist-applied, unexposed wafer is picked up from the wafer stocker and is set on the wafer stage (step S101).

Figure 17A:
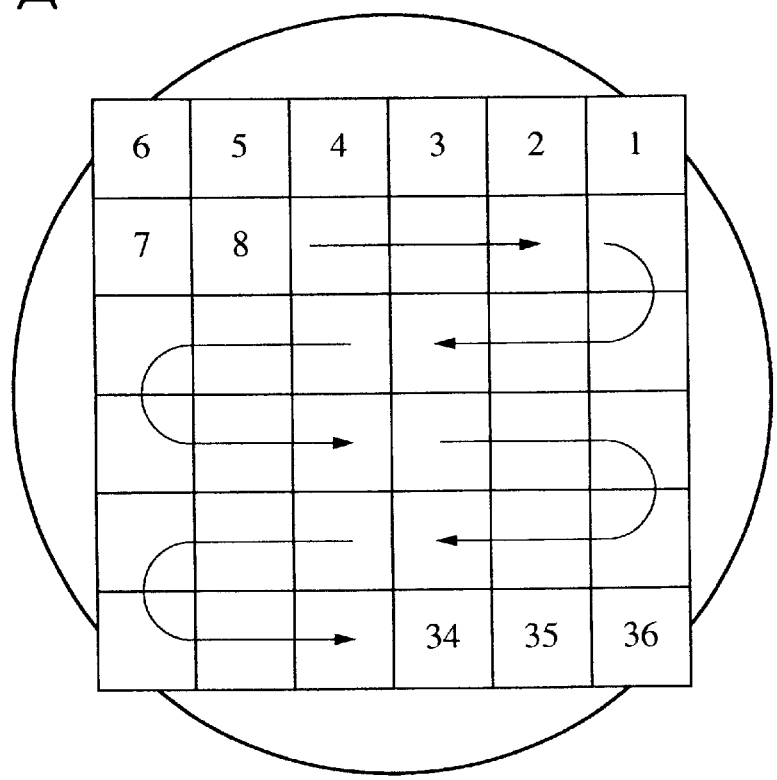
FIG. 17A and FIG. 17B illustrate the exposure sequence in accordance with a mask in use.

When both the mask and wafer are set, a plurality of areas of the wafer, namely, a total of thirty-six shot areas, are individually exposed to a periodic pattern of the mask M1 according to the step-and-scan sequence or the step-and-repeat sequence as shown in FIG. 17A. The exposure is performed in the order of an increasing shot area number, starting with the shot area 1 and ending with the shot area 36 (step S102). The scan direction or scanning and exposure in each shot area is vertically aligned in FIG. 17A.

A first feature of the process in this embodiment is hat the wafer stage is kept on standby subsequent to the exposure of the shot area 36 without moving from its last position (step S103). The shot area last exposed thus remains there.

The mask M1 is retrieved from the mask stage while the mask M2, remaining on standby at the standby position after being picked up from the mask stocker, is fed and set on the mask stage. The mask M1 and the mask M2 are thus interchanged with each other (step S104). The handling mechanisms described above perform the mask retrieval and the mask feed substantially at the same time, and the interchange of the masks is carried out in a short period of time.

Figure 17B:
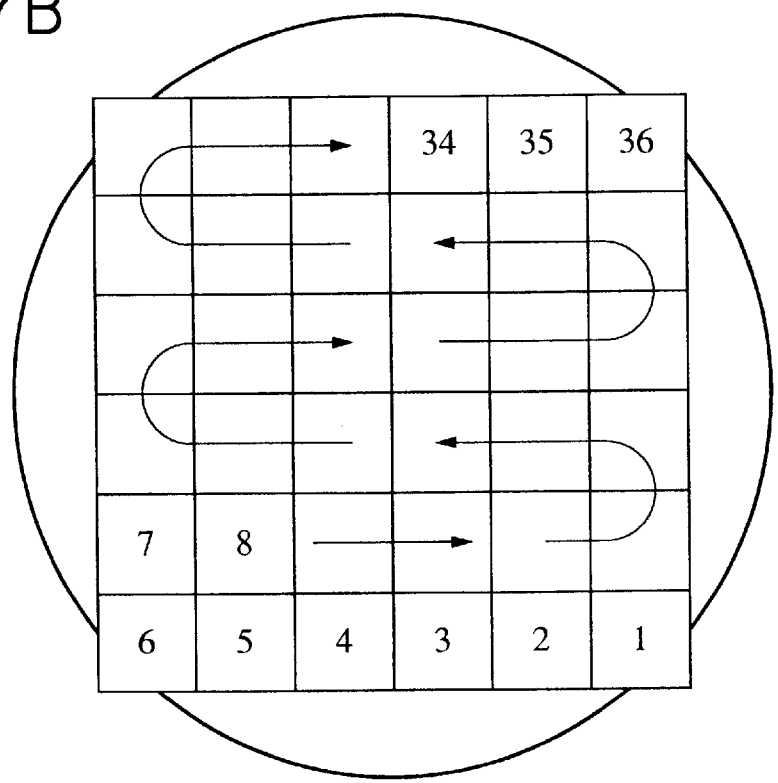

Each shot area to which the periodic pattern of the mask M1 is transferred is then subjected to the pattern of the mask M2 in the multiple exposures. Since the wafer stage remains in position, the shot area 36 that was exposed last through the mask M1 stays at the position of the optical axis (exposure position) of the projection optical system. The exposure of the wafer to the mask M2 starts with the shot area 36 as shown in FIG. 17B, and proceeds in the order of decreasing shot number ending with the shot area 1 (step S105). This arrangement eliminates the unnecessary operation of returning the wafer stage to the shot area 1 when the mask is interchanged. Therefore, this arrangement reduces the motion of the aligner arising from the returning operation, reduces the time required to position the wafer stage, and increases the throughput of the aligner.

Based on the principle of the multiple exposures, a portion where the sum of the exposure amounts of the patterns of the mask M1 and the mask M2 exceeds the threshold value of the resist is developed in each shot area. A pattern having a resolution higher than that of the aligner in use is thus transferred to the wafer.

When one layer of a single wafer is exposed as described above, the exposed wafer is retrieved, and a new wafer is fed and set on the wafer stage (step S107). If the wafer stage is set to be closest to a wafer replacement position when the shot area 1 is aligned to the exposure position, the travel and time of the wafer stage involved in the wafer replacement are minimized, and the throughput is increased even more. This advantage is effective when a first exposed shot area agrees with the first exposed area at the start of the process (shot area 1 in the above example) with the multiple exposure for the one layer completed through the above process, namely, when the number of masks used in the multiple exposure is 2 or an integer multiple of 2.

A second feature of the process of this embodiment is that when one wafer is completed and replaced with another wafer, the mask used immediately prior to the replacement of the wafer is not interchanged with another mask (step S106).

The new wafer is now first exposed to the mask M2 in the order of increasing number, starting with the shot area 1 and ending with the shot area 36, to perform the standard projection exposure to each shot area on the new wafer (step S108). With the wafer stage kept as it is (step S109), the mask M2 is interchanged with the mask M1 (step S110). The shot areas of the wafer are then exposed to the periodic pattern in the reverse order (from the shot area 36 to the shot area 1) in the multiple exposures (step S111). Specifically, the exposure order of the mask M2 is shown in FIG. 17A and the exposure order of the mask M1 is shown in FIG. 17B. The overlapped pattern remains unchanged in the multiple exposures regardless of whether the two-beam interference exposure or the standard projection exposure is made first. Taking this property of the multiple exposures, the throughput of the aligner is improved by alternating the exposure orders of the two types of patterns each time the wafer is changed.

With the mask M1 kept as it is (step S112), the wafer is retrieved (step S113). It is determined whether exposure of all wafers in the stocker is completed (step S114). When the aligner has yet to expose any wafer, the aligner returns to step S101. When exposure of all wafers is completed, the masks are retrieved from the mask stage, and the process ends (step S115). Exposed wafers stored in the stocker are sent to a development unit, which performs a development process (step S116).

In the above flow diagram, the number of wafers to be processed is even. When it is not known whether the number of wafers is even or odd, a determination step such as step S114 may be included subsequent to step S106. When it is determined that exposure of all wafers is completed, exposed wafers are retrieved and the aligner jumps to step S115.

As described above, in the first feature, each of the plurality of shot areas of the wafer is exposed to the plurality of masks (mask patterns) in the multiple exposures with the mask patterns being interchanged. The plurality of wafers are exposed to each mask with one wafer being replaced with the next wafer. When the wafer is exposed to the next mask (mask pattern) that replaced the one mask (mask pattern), the last exposed shot area of the wafer is first exposed to the next mask. In the second feature, each of the plurality of shot areas of the wafer is exposed to the plurality of masks (mask patterns) in the multiple exposures with the patterns being interchanged. The plurality of wafers is exposed to each mask with one wafer being replaced with the next wafer. When the next wafer, which replaced the one wafer, is exposed to the mask after the one wafer was exposed to the mask, the mask (mask pattern) last used for the one wafer is used, as it is, to perform a first exposure for the next wafer. Even if one of the two features is used alone, the advantages of the present invention are sufficiently enjoyed. However, a combination of the two features results in substantial improvements in the overall throughput.

This embodiment applies to any of the step-and repeat processes in which a single shot area is scanned and exposed, and the step-and-scan process in which a full single shot area is exposed at one time. In any process, the embodiment results in improvements in the overall throughput by reducing the number of mask interchanges and motion of the wafer. Particularly, in the step-and-scan process, improvements in the throughput are substantial for the following reason. Specifically, since the mask is accelerated from its stopped state to scan-and-expose the wafer and is then decelerated to a halt in the step-and-scan process, the mask interchange time is relatively significant to the time required to expose the wafer. The reduction in the number of mask interchanges per wafer greatly contributes to improvements in the throughput.

Figure 18:
FIG. 18 illustrates the procedure of interchanging a mask and a wafer when two masks are in use.

When a single area is exposed using two types of mask patterns, the number of mask interchanges is halved and the throughput is substantially improved. FIG. 18 explains this improvement. After a first wafer W1 is exposed in the order of masks M1 and M2, the wafer W1 is replaced with a second wafer W2. The second wafer W2 is exposed in the order of masks M2 and M1. A third wafer W3 is exposed in the order of masks M1 and M2 in the same manner as the first wafer W1. A fourth wafer and subsequent wafers are exposed in the same manner as above. In this way, one mask interchange step per wafer is saved, and the number of mask interchanges is thus halved.

Figure 19:
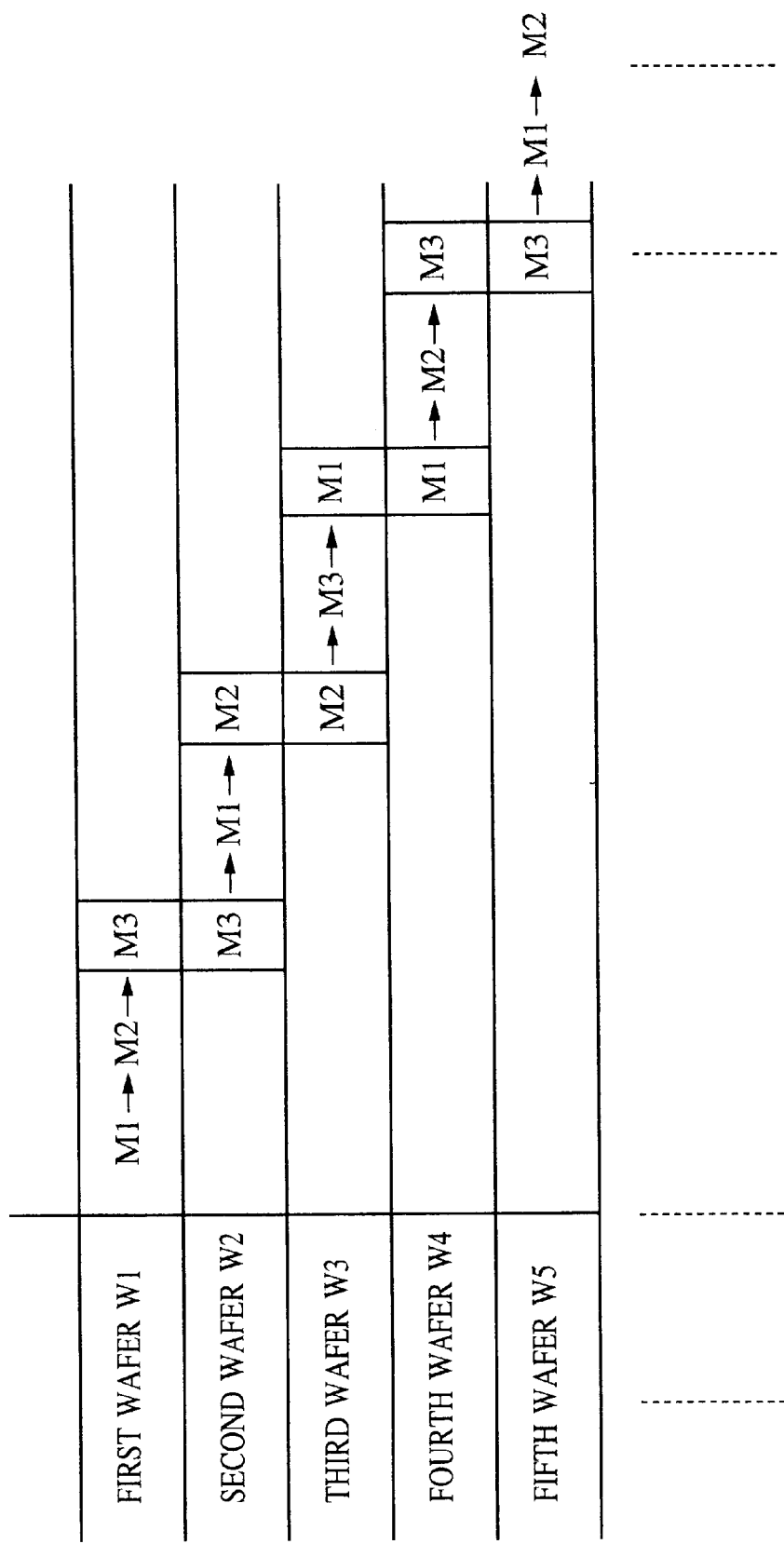
FIG. 19 illustrates the procedure of interchanging a mask and a wafer when three masks are in use.

The masks used for one layer of wafers are not limited to two masks M1 and M2, and may be more than two masks. For example, FIG. 19 shows a process in which three masks, M1, M2 and M3, are used. In this case, one mask interchange step per wafer is saved, and the total number of mask interchanges is reduced to two-thirds.

Figure 20A:
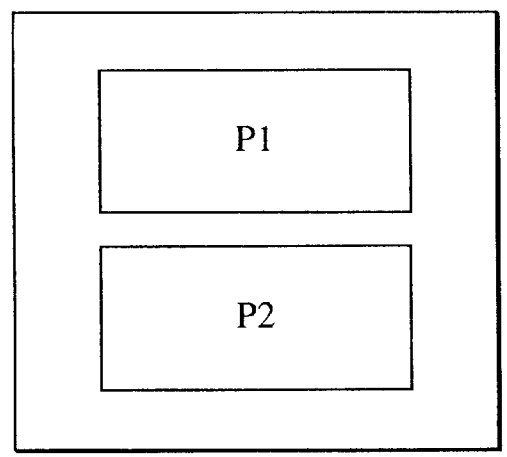
FIG. 20A through FIG. 20C are explanatory diagrams illustrating a plurality of patterns that are formed in a single mask.
Figure 20B:
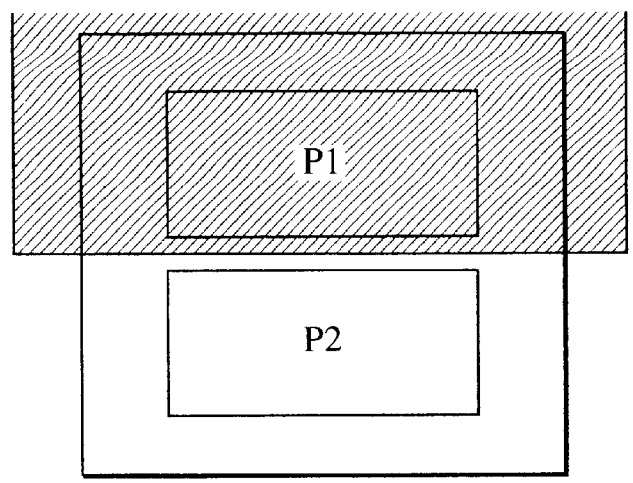
Figure 20C:
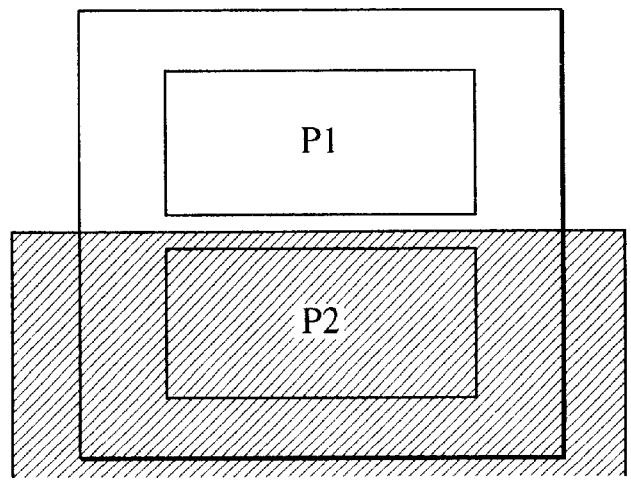

Instead of using a plurality of masks, a mask having a plurality of patterns on it may be used as shown in FIG. 20A through FIG. 20C. If three or more patterns are required, three or more patterns may be formed on the same mask. Referring to FIG. 20A to FIG. 20C, the area of the mask pattern not used is shielded by a masking blade, which controls an illumination area in the illumination optical system in the aligner, and only a necessary pattern is selectively illuminated. The mask pattern is thus switched, in other words, the mask pattern is interchanged. It is important that a plurality of mask patterns be prepared and that the exposure be performed with the mask patterns being interchanged. To achieve this, a variety of uses is possible. For example, a plurality of masks, each having its own pattern, is prepared, or a single mask having a plurality of patterns is prepared.

The present invention applies not only to the multiple exposures, but also, to the stitching exposure technique in which a plurality of patterns are stitched on a wafer to form a large area chip pattern. Specifically, a plurality of mask patterns are interchanged to stitch them and to form a large exposure area pattern. This operation is performed to a plurality of wafers with one wafer being replaced with the next. When the one wafer is replaced with the next one, the next one is exposed to the last exposed mask pattern immediately prior to the replacement. The number of mask pattern interchanges is thus reduced. When the mask pattern is interchanged on the same wafer, the chip pattern of the last exposed area immediately prior to the interchange is first exposed to the next mask. The motion of the wafer is thus minimized.

As described above, the wafer having a plurality of areas is subjected to the multiple exposures or the stitching exposure with the plurality of mask patterns being interchanged. The plurality of wafers is exposed with one wafer being replaced with another. When the one wafer is replaced with the next wafer, the next wafer is first exposed to the last used mask pattern, prior to the replacement of the wafer. When the mask pattern is interchanged with the next mask pattern, the area of the wafer last exposed to the mask is first exposed to the next mask. Thereby, the number of mask pattern interchanges and/or unnecessary motion of the wafer are reduced, and the overall throughput is thus substantially improved.

Embodiment of a Device Manufacturing Method

A device manufacturing method, based on the above aligner and the aligning method, is now discussed.

Figure 21:
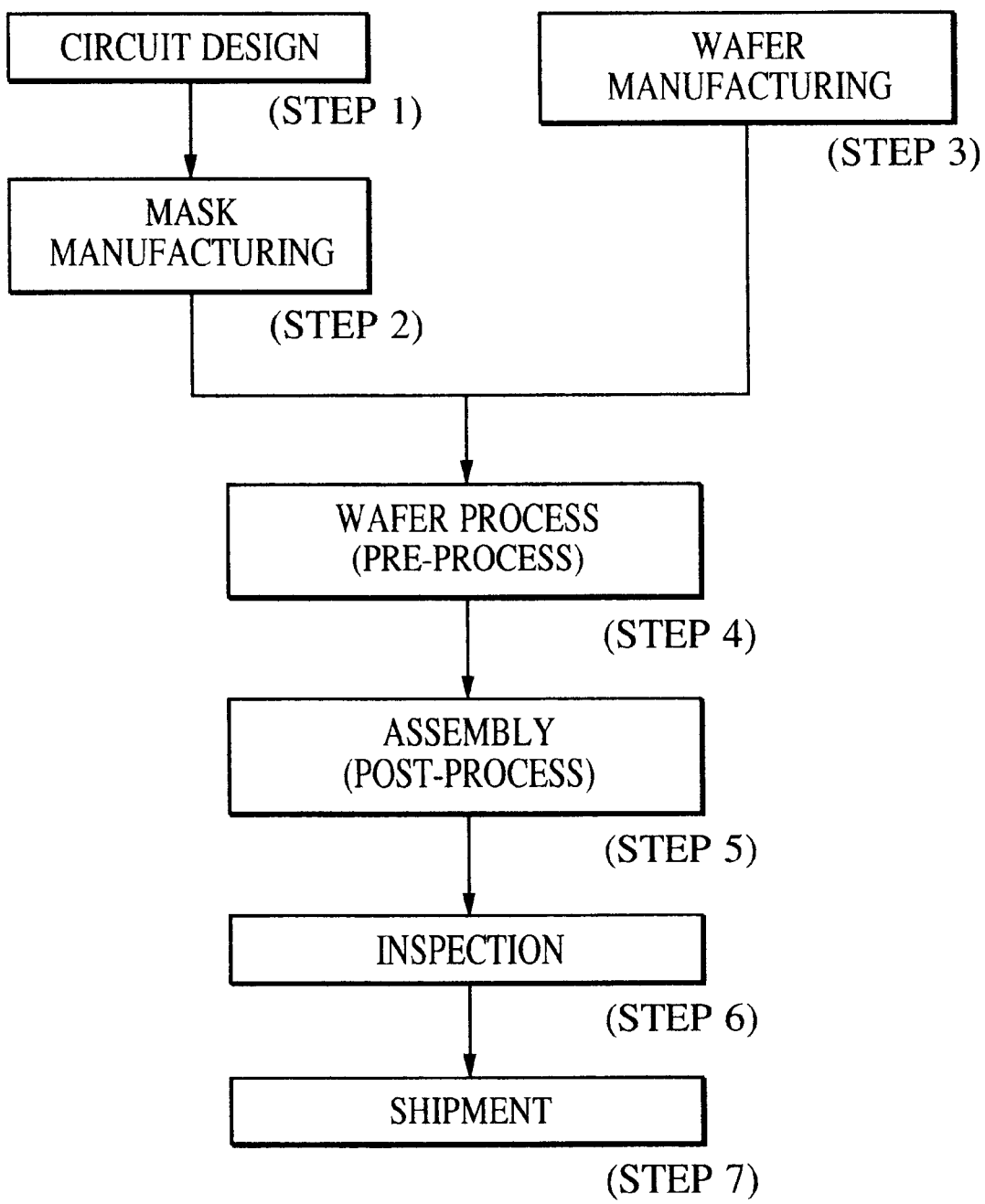
FIG. 21 is a process flow diagram for manufacturing a semiconductor device.

FIG. 21 shows the process flow for manufacturing micro devices (e.g., semiconductor chips such as ICs and LSIs, liquid-crystal panels, CCDs, thin-film magnetic heads, and micro-machines). In step 1 (circuit design), a circuit of a semiconductor device is designed. In step 2 (mask manufacturing), a mask of the circuit pattern designed is manufactured. In step 3 (wafer manufacturing), a wafer is manufactured using a material such as silicon or glass. Step 4 (wafer process) is called a pre-process, and forms an actual circuit on the wafer using the prepared mask and the wafer through lithographic techniques. Step 5 (assembly) is called a post-process, and produces a semiconductor chip from the wafer manufactured in step 4. Step 5 includes an assembly step (dicing and bonding), and a packaging step (chip encapsulating). In step 6 (inspection), operation tests and endurance tests are conducted on the semiconductor device manufactured in step 5. After undergoing these steps, the semiconductor device is completed and shipped (step 7).

Figure 22:
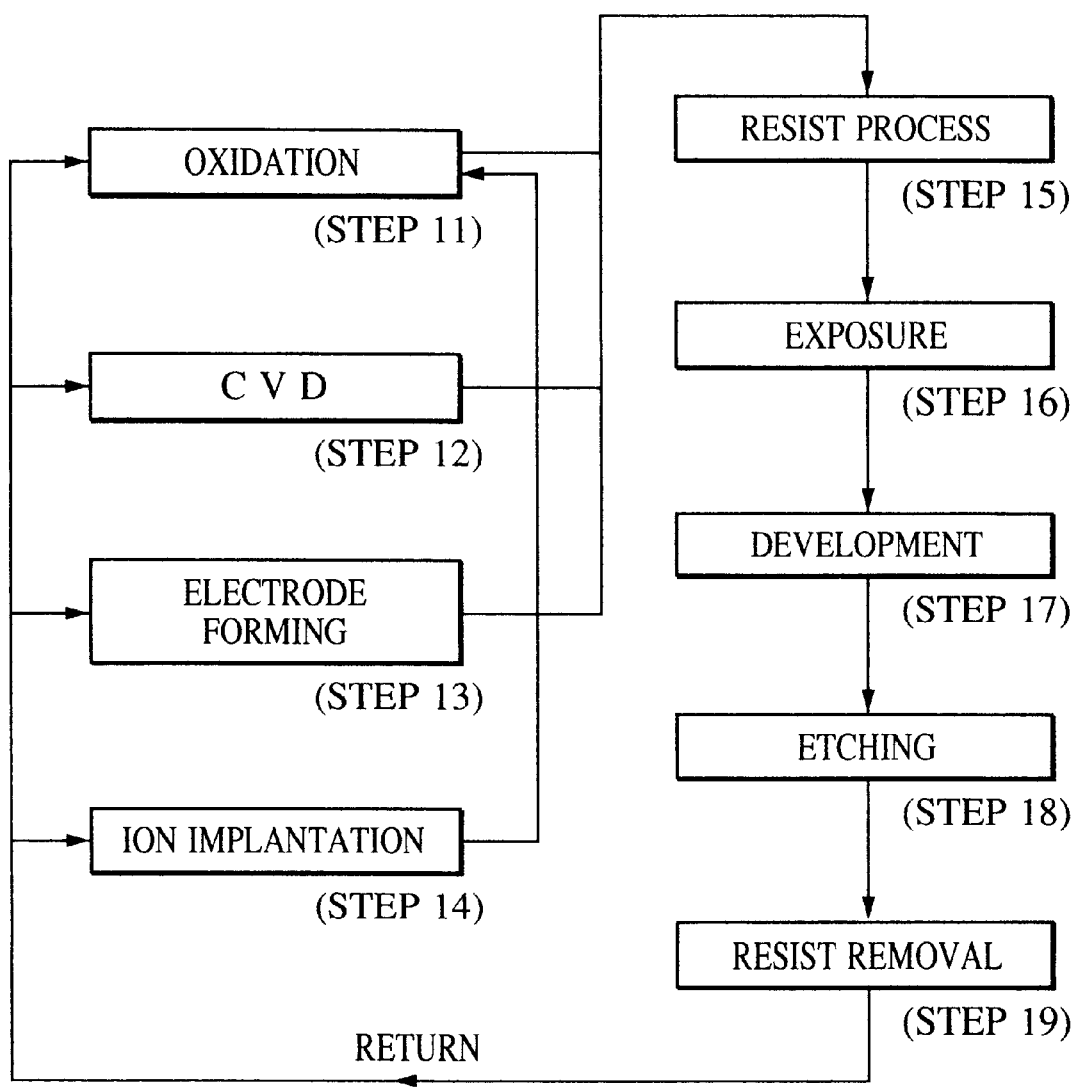
FIG. 22 is a detailed process flow diagram for a wafer process.

FIG. 22 is a detailed flow diagram of the wafer process. In step 11 (oxidation), the surface of the wafer is oxidized. In step 12 (CVD), an insulating film is formed on the wafer surface. In step 13 (electrode forming), an electrode is deposited on the wafer. In step 14 (ion implantation), ions are implanted to the wafer. In step 15 (resist process), a photosensitive agent is applied on the wafer. In step 16 (exposure), a plurality of shot areas on the wafer is exposed to the circuit pattern of a mask through the multiple exposures according to the already-described projection aligner and aligning method. In step 17 (development), the exposed wafer is subjected to a development process. In step 18 (etching), a portion other than the developed resist image is etched away. In step 19 (resist removal), a resist, no longer required after etching, is removed. The circuit pattern is formed in a multi-layered fashion on the wafer after undergoing a repetition of these steps. The manufacturing method of this embodiment thus permits, to be easily manufactured at a high yield, thus, at a low cost, a semiconductor device having a high degree of integration, which was conventionally difficult to manufacture.

According to the aligner and the aligning method of the present invention, the number of mask pattern interchanges and/or motion of the wafer are reduced, and the overall throughput is thus substantially improved. With the multiple exposures employed, a resolution pattern finer than that in the conventional art results, and improvements both in throughput and resolution are attained at the same time. With the stitching exposure, a chip is made larger in size than that in the conventional art, and improvements both in throughput and resolution are attained at the same time.

The device manufacturing method of the present invention thus permits, to be easily manufactured at a high yield, at a low cost, a high-resolution device, which was conventionally difficult to manufacture.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An aligning method comprising the steps of:

exposing a wafer having a plurality of areas to a plurality of mask patterns, with one mask pattern being interchanged with a next mask pattern;

exposing a next wafer to the one mask pattern used immediately prior to a replacement, when one wafer is replaced with the next wafer; and exposing an area of the one wafer last exposed to the one mask pattern under a first type of illumination, to the next mask pattern under a second type of illumination, when the one mask pattern is interchanged with the next mask pattern, wherein one of said first type of illumination and said second type of illumination is an illumination from a direction perpendicular to a surface of the one mask pattern, and the other of said first type of illumination and said second type of illumination is an illumination from a direction inclined to a surface of the next mask pattern.

2. An aligning method according to claim 1, wherein the plurality of mask patterns are respectively formed in a plurality of different masks.

3. An aligning method according to claim 2, further comprising carrying out the retrieval of one mask pattern and the feed of the other mask pattern, substantially at the same time, when the mask patterns are interchanged.

4. An aligning method according to claim 1, further comprising performing a stitching exposure using the plurality of mask patterns, with one mask pattern being interchanged with another.

5. An aligning method according to claim 1, further comprising using mask patterns of an integer multiple of two, to expose each area of the wafer.

6. An aligning method according to claim 1, further comprising exposing the plurality of areas of the wafer sequentially, one after another, in accordance with a step-and-scan process sequence.

7. An aligning method according to claim 1, further comprising exposing the plurality of areas of the wafer sequentially, one after another, in accordance with a step-and repeat process sequence.

8. An aligning method according to claim 1, wherein the area is a shot area.

9. An aligning method according to claim 8, wherein at least one chip pattern is formed in the shot area.

10. An aligning method according to claim 1, further comprising performing multiple exposures using the plurality of mask patterns, with one mask pattern being interchanged with another.

11. An aligning method according to claim 10, further comprising exposing the wafer to a first mask pattern under coherent illumination, and to a second mask pattern under partially coherent illumination.

12. An aligning method according to claim 12, wherein the multiple exposures include a two-beam interference exposure using a first mask pattern and a standard projection exposure using a second mask pattern, and wherein the wafer is exposed to have a multi-value exposure distribution in at least one of the multiple exposures.

13. An aligning method according to claim 12, wherein each of the two-beam interference exposure and the standard projection exposure includes at least one exposure step.

14. An aligning method according to claim 13, wherein said exposing steps comprise using an exposure light beam having a wavelength of at most 250 nm.

15. An aligning method comprising the steps of:

exposing a wafer having a plurality of areas to a plurality of mask patterns, with one mask pattern being interchanged with a next mask pattern, to perform the exposure on a plurality of wafers, with one wafer being replaced with a next wafer;

exposing the next wafer to the one mask pattern used immediately prior to a replacement, when the one wafer is replaced with the next wafer; and exposing an area of the one wafer last exposed to the one mask pattern, to the next mask pattern, when the one mask pattern is interchanged with the next mask pattern, wherein the plurality of mask patterns are formed in the same mask.

16. A method of manufacturing devices comprising the steps of:

exposing a wafer having a plurality of areas to a plurality of mask patterns, with one mask pattern being interchanged with a next mask pattern, exposing the next wafer to the one mask pattern used immediately prior to a replacement, when one wafer is replaced with the next wafer;

first exposing an area of the one wafer last exposed to the one mask pattern under a first type of illumination, to the next mask pattern under a second type of illumination, when the one mask pattern is interchanged with the next mask pattern; and thereafter, developing the wafers to manufacture devices, wherein one of said first type of illumination and said second type of illumination is an illumination from a direction perpendicular to a surface of the one mask pattern, and the other of said first type of illumination and said second type of illumination is an illumination from a direction inclined to a surface of the next mask pattern.

17. An aligner comprising:

a mask stage for holding a mask;

a wafer stage for holding a wafer; and exposure means for illuminating the mask to expose the wafer, wherein said exposure means exposes a plurality of areas of the wafer to a plurality of masks, with one mask for exposure under one type of illumination being interchanged with a next mask for exposure under a different type of illumination, and when a next wafer on said wafer stage is exposed to the mask, subsequent to the exposure of one wafer, the next wafer is first exposed to the mask held by said mask stage, wherein one of said one type of illumination and said different type of illumination is an illumination from a direction perpendicular to a surface of the one mask, and the other of said one type of illumination and said different type of illumination is an illumination from a direction inclined to a surface of the next mask.

18. An aligner comprising:

a mask stage for holding a mask;

a wafer stage for holding a wafer; and exposure means for illuminating the mask to expose the wafer, wherein said exposure means exposes a plurality of areas of the wafer to a plurality of masks, with one mask being interchanged with a next mask, and when one wafer is exposed to a next mask, subsequent to the exposure of the one wafer to the one mask under a first type of illumination, a last exposed area of the one wafer is first exposed to the next mask under a second type of illumination, wherein one of said first type of illumination and said second type of illumination is an illumination from a direction perpendicular to a surface of the one mask, and the other of said first type of illumination and said second type of illumination is an illumination from a direction inclined to a surface of the next mask.

19. An aligner according to one of claims 17 or 18, wherein said exposure means exposes a plurality of areas of the wafer in accordance with one of a step-and-scan process sequence and a step-and-repeat process sequence.

20. An aligner according to one of claims 17 or 18, wherein said exposure means performs multiple exposures, including an exposure using a first mask and an exposure using a second mask.

21. An aligner according to claim 20, wherein said exposure means exposes the wafer to a first mask under coherent illumination and exposes the wafer to a second mask under partially coherent illumination.

22. An aligner according to one of claims 17 or 18, wherein said exposure means performs a stitching exposure including an exposure using a first mask and an exposure using a second mask.

23. An aligner according to one of claims 17 or 18, wherein said exposure means includes, as a light source, one of a KrF excimer laser, an ArF excimer laser, and an F2 laser.

24. An aligner according to one of claims 17 or 18, wherein said exposure means comprises a mechanism that performs a retrieval of one mask from said mask stage and a feed of the other mask to said mask stage, substantially at the same time, when the masks are interchanged.

25. An exposing method comprising the steps of:

exposing a wafer, having a plurality of areas, to a plurality of mask patterns, with one mask pattern being interchanged with a next mask pattern, wherein the plurality of mask patterns are respectively formed in a plurality of different masks; and exposing an area of the wafer last exposed to the one mask pattern under a first type of illumination, to the next mask pattern under a second type of illumination, after the one mask pattern is interchanged with the next mask pattern, wherein one of said first type of illumination and said second type of illumination is an illumination from a direction perpendicular to a surface of the one mask pattern, and the other of said first type of illumination and said second type of illumination is an illumination from a direction inclined to a surface of the next mask pattern.

26. An exposing method according to claim 25, further comprising carrying out the retrieval of the one mask pattern and feeding of the next mask pattern, substantially at the same time, when the mask patterns are interchanged.

27. An exposing method according to claim 25, further comprising performing a stitching exposure by using the plurality of mask patterns.

28. An exposing method according to claim 25, further comprising exposing the plurality of areas of the wafer sequentially in accordance with a step-and-scan process sequence.

29. An exposing method according to claim 25, further comprising exposing the plurality of area of the wafer sequentially in accordance with a step-and-repeat process sequence.

30. An exposing method according to claim 25, further comprising performing multiple exposures by using the plurality of mask patterns.

31. An exposing method according to claim 30, further comprising exposing the wafer to the one mask pattern under coherent illumination, and to the next mask pattern under partially coherent illumination.

32. An exposing method according to claim 30, wherein the multiple exposures include a two-beam interference exposure using the one mask pattern and a standard projection exposure using the next mask pattern.

33. An exposing method according to claim 32, wherein the wafer is exposed to have a multi-value exposure distribution in at least one of the multiple exposures.

34. A device manufacturing method comprising the steps of:

exposing a wafer, having a plurality of areas, to a plurality of mask patterns, with one mask pattern being interchanged with a next mask pattern, wherein the plurality of mask patterns are respectively formed in a plurality of different masks;

exposing an area of the wafer last exposed to the one mask pattern under a first type of illumination, to the next mask pattern under a second type of illumination, after the one mask pattern is interchanged with the next mask pattern; and thereafter, developing the wafer to manufacture devices, wherein one of said first type of illumination and said second type of illumination is an illumination from a direction perpendicular to a surface of the one mask pattern, and the other of said first type of illumination and said second type of illumination is an illumination from a direction inclined to a surface of the next mask pattern.

35. A device manufacturing method according to claim 34, further comprising carrying out the retrieval of the one mask pattern and feeding of the next mask pattern, substantially at the same time, when the mask patterns are interchanged.

36. A device manufacturing method according to claim 34, further comprising performing a stitching exposure by using the plurality of mask patterns.

37. A device manufacturing method according to claim 34, further comprising exposing the plurality of areas of the wafer sequentially in accordance with a step-and-scan process sequence.

38. A device manufacturing method according to claim 34, further comprising exposing the plurality of areas of the wafer sequentially in accordance with a step-and-repeat process sequence.

39. A device manufacturing method according to claim 34, further comprising performing multiple exposures by using the plurality of mask patterns.

40. A device manufacturing method according to claim 39, further comprising exposing the wafer to the one mask pattern under coherent illumination, and to the next mask pattern under partially coherent illumination.

41. A device manufacturing method according to claim 39, wherein the multiple exposures include a two-beam interference exposure using the one mask pattern and a standard projection exposure using the next mask pattern.

42. A device manufacturing method according to claim 41, wherein the wafer is exposed to have a multi-value exposure distribution in at least one of the multiple exposures.

43. An exposing method comprising the steps of:

exposing a wafer, having a plurality of areas, to a plurality of mask patterns, with one mask pattern being interchanged with a next mask pattern;

exposing an area of the wafer last exposed to the one mask pattern, to the next mask pattern, after the one mask pattern is interchanged with the next mask pattern; and performing multiple exposure by using the plurality of mask patterns by exposing the wafer to the one mask pattern under coherent illumination, and to the next mask pattern under partially coherent illumination.

44. An exposing method according to claim 43, wherein the plurality of mask patterns are respectively formed in a plurality of different masks.

45. An exposing method according to claim 44, further comprising carrying out the retrieval of the one mask pattern and feeding of the next mask pattern, substantially at the same time, when the mask patterns are interchanged.

46. An exposing method according to claim 43, wherein the plurality of mask patterns are formed in a same mask.

47. An exposing method according to claim 43, further comprising performing a stitching exposure by using the plurality of mask patterns.

48. An exposing method according to claim 43, further comprising exposing the plurality of areas of the wafer sequentially in accordance with a step-and-scan process sequence.

49. An exposing method according to claim 43, further comprising exposing the plurality of areas of the wafer sequentially in accordance with a step-and-repeat process sequence.

50. An exposing method according to claim 43, wherein the multiple exposure include a two-beam interference exposure using the one mask pattern and a standard projection exposure using the next mask pattern.

51. An exposing method according to claim 50, wherein the wafer is exposed to have a multi-value exposure distribution in at least one of the multiple exposures.

52. An exposing method comprising the steps of:

exposing a wafer, having a plurality of areas, to a plurality of mask patterns, with one mask pattern being interchanged with a next mask pattern;

exposing an area of the wafer last exposed to the one mask pattern under a first type of illumination, to the next mask pattern under a second type of illumination, after the one mask pattern is interchanged with the next mask pattern; and performing multiple exposure by using the plurality of mask patterns, wherein the multiple exposures include a two-beam interference exposure using the one mask pattern and a standard projection exposure using the next mask pattern, wherein one of said first type of illumination and said second type of illumination is an illumination from a direction perpendicular to a surface of the one mask pattern, and the other of said first type of illumination and said second type of illumination is an illumination from a direction inclined to a surface of the next mask pattern.

53. An exposing method according to claim 52, wherein the plurality of mask patterns are respectively formed in a plurality of different masks.

54. An exposing method according to claim 53, further comprising carrying out the retrieval of the one mask pattern and feeding of the next mask pattern, substantially at the same time, when the mask patterns are interchanged.

55. An exposing method according to claim 52, further comprising performing a stitching exposure by using the plurality of mask patterns.

56. An exposing method according to claim 52, further comprising exposing the plurality of areas of the wafer sequentially in accordance with a step-and-scan process sequence.

57. An exposing method according to claim 52, further comprising exposing the plurality of areas of the wafer sequentially in accordance with a step-and-repeat process sequence.

58. An exposing method according to claim 52, further comprising exposing the wafer to the one mask pattern under coherent illumination, and to the next mask pattern under partially coherent illumination.

59. An exposing method according to claim 52, wherein the wafer is exposed to have a multi-value exposure distribution in at least one of the multiple exposures.

60. An exposing method comprising the steps of:
exposing a wafer, having a plurality of areas, to a plurality of mask patterns, with one mask pattern being interchanged with a next mask pattern;
exposing an area of the wafer last exposed to the one mask pattern, to the next mask pattern, after the one mask pattern is interchanged with the next mask pattern; and
performing multiple exposure by using the plurality of mask patterns, wherein the multiple exposures include a two-beam interference exposure using the one mask pattern and a standard projection exposure using the next mask pattern,
wherein the plurality of mask patterns are formed in a same mask.

61. A device manufacturing method comprising the steps of:
exposing a wafer, having a plurality of areas, to a plurality of mask patterns, with one mask pattern being interchanged with a next mask pattern and performing multiple exposures by using the plurality of mask patterns;
exposing an area of the wafer last exposed to the one mask pattern, to the next mask pattern, after the one mask pattern is interchanged with the next mask pattern;
exposing the wafer to the one mask pattern under coherent illumination, and to the next mask pattern under partially coherent illumination; and
thereafter, developing the wafer to manufacture devices.

62. A device manufacturing method according to claim 61, wherein the plurality of mask patterns are respectively formed in a plurality of different masks.

63. A device manufacturing method according to claim 62, further comprising carrying out the retrieval of the one mask pattern and feeding of the next mask pattern, substantially at the same time, when the mask patterns are interchanged.

64. A device manufacturing method according to claim 61, wherein the plurality of mask patterns are formed in a same mask.

65. A device manufacturing method according to claim 61, further comprising performing a stitching exposure by using the plurality of mask patterns.

66. A device manufacturing method according to claim 61, further comprising exposing the plurality of areas of the wafer sequentially in accordance with a step-and-scan process sequence.

67. A device manufacturing method according to claim 61, further comprising exposing the plurality of areas of the wafer sequentially in accordance with a step-and-repeat process sequence.

68. A device manufacturing method according to claim 61, wherein the multiple exposures include a two-bean interference exposure using the one mask pattern and a standard projection exposure using the next mask pattern.

69. A device manufacturing method according to claim 68, wherein the wafer is exposed to have a multi-value exposure distribution in at least one of the multiple exposures.

70. A device manufacturing method comprising the steps of:
exposing a wafer, having a plurality of areas, to a plurality of mask patterns, with one mask pattern being interchanged with a next mask pattern and performing multiple exposures by using the plurality of mask patterns, wherein the multiple exposures include a two-beam interference exposure using the one mask pattern and a standard projection exposure using the next mask pattern; and
exposing an area of the wafer last exposed to the one mask pattern under a first type of illumination, to the next mask pattern under a second type of illumination after the one mask pattern is interchanged with the next mask pattern; and
thereafter, developing the wafer to manufacture devices, wherein one of said first type of illumination and said second type of illumination is an illumination from a direction perpendicular to a surface of the one mask, and the other of said first type of illumination and said second type of illumination is an illumination from a direction inclined to a surface of the next mask.

71. A device manufacturing method according to claim 70, wherein the plurality of mask patterns are respectively formed in a plurality of different masks.

72. A device manufacturing method according to claim 71, further comprising carrying out the retrieval of the one mask pattern and feeding of the next mask pattern, substantially at the same time, when the mask patterns are interchanged.

73. A device manufacturing method according to claim 70, further comprising performing a stitching exposure by using the plurality of mask patterns.

74. A device manufacturing method according to claim 70, further comprising exposing the plurality of areas of the wafer sequentially in accordance with a step-and-scan process sequence.

75. A device manufacturing method according to claim 70, further comprising exposing the plurality of areas of the wafer sequentially in accordance with a step-and-repeat process sequence.

76. A device manufacturing method according to claim 70, further comprising exposing the wafer to the one mask pattern under coherent illumination, and to the next mask pattern under partially coherent illumination.

77. A device manufacturing method according to claim 70, wherein the wafer is exposed to have a multi-value exposure distribution in at least one of the multiple exposures.

78. A device manufacturing method comprising the steps of:
exposing a wafer, having a plurality of areas, to a plurality of mask patterns, with one mask pattern being interchanged with a next mask pattern and performing multiple exposures by using the plurality of mask patterns, wherein the multiple exposures include a two-beam interference exposure using the one mask pattern and a standard projection exposure using the next mask pattern; and
exposing an area of the wafer last exposed to the one mask pattern, to the next mask pattern, after the one mask pattern is interchanged with the next mask pattern; and
thereafter, developing the wafer to manufacture devices, wherein the plurality of mask patterns are formed in a same mask.

* * * * *

UNITED STATES PATENT AND TRADEMARK OFFICE
CERTIFICATE OF CORRECTION

PATENT NO. : 6,714,302 B2
DATED : March 30, 2004
INVENTOR(S) : Akiyoshi Suzuki et al.

It is certified that error appears in the above-identified patent and that said Letters Patent is hereby corrected as shown below:

Column 1,
Line 13, "such" should read -- such as --.

Column 5,
Line 60, "ling" should read -- line --.

Column 6,
Line 51, "theses" should read -- these --.

Column 7,
Line 44, the second occurrence of "a" should read -- σ --.

Column 10,
Line 17, "hat" should read -- that --.

Column 14,
Line 56, "claim 12," should read -- claim 10, --.

Column 16,
Lines 8, 12, 20, 23 and 26, "or" should read -- and --.

Column 18,
Line 27, "exposure" should read -- exposures --.

Column 19,
Line 61, "two-bean" should read -- two-beam --.

Signed and Sealed this

Seventeenth Day of August, 2004

JON W. DUDAS
*Acting Director of the United States Patent and Trademark Office*